(12) United States Patent
Ishikawa

(10) Patent No.: US 7,101,807 B2
(45) Date of Patent: *Sep. 5, 2006

(54) METHOD OF FABRICATING SEMICONDUCTOR DEVICE

(75) Inventor: Akira Ishikawa, Kanagawa (JP)

(73) Assignee: Semiconductor Energy Laboratory Co., Ltd., (JP)

( * ) Notice: Subject to any disclaimer, the term of this patent is extended or adjusted under 35 U.S.C. 154(b) by 0 days.

This patent is subject to a terminal disclaimer.

(21) Appl. No.: 10/998,920

(22) Filed: Nov. 29, 2004

(65) Prior Publication Data

US 2005/0095772 A1   May 5, 2005

Related U.S. Application Data

(63) Continuation of application No. 10/434,012, filed on May 8, 2003, now Pat. No. 6,833,327.

(30) Foreign Application Priority Data

May 17, 2002   (JP) .............................. 2002-143892

(51) Int. Cl.
*H01L 21/302* (2006.01)
*H01L 21/461* (2006.01)

(52) U.S. Cl. ................ 438/740; 438/725; 438/734

(58) Field of Classification Search ........... 438/725, 438/734, 740, 696, 627, 952, 153
See application file for complete search history.

(56) References Cited

U.S. PATENT DOCUMENTS

| 5,644,146 A | 7/1997 | Arai et al. ............. 257/66 |
| 6,225,150 B1 | 5/2001 | Lee et al. ............. 438/153 |

(Continued)

FOREIGN PATENT DOCUMENTS

JP   7-202210   8/1995

(Continued)

OTHER PUBLICATIONS

Tarui, Y., "Basic Technology for VLSI (Part II)," IEEE Transactions on Electron Devices, vol. ED-27, No. 8, pp. 1321-1331, Aug. 1980.

*Primary Examiner*—Walter L. Lindsay, Jr.
(74) *Attorney, Agent, or Firm*—Cook, Alex, McFarron, Manzo, Cummings & Mehler, Ltd.

(57) ABSTRACT

In the step of forming a gate electrode in the region having the line width in which the miniaturization has been progressed, the present invention provides a method of fabricating a thin film transistor (TFT) whose patterning margin can be enlarged without requiring carrying out the photolithography multiple times. According to a fabricating method of the present invention, the mask pattern of the first layer and the mask pattern of the second layer can be formed in a self-aligned process and as a mask pattern which is analog and whose size are different from each other by performing the photolithography once. The hut shape gate can be formed in a self-aligned process by setting the line width located on the active layer so as to be Li in the mask pattern of the first layer, and so as to be L' in the mask pattern of the second layer, and by in turn carrying out the anisotropic etching using the mask pattern of the second layer and the anisotropic etching using the mask pattern of the first layer. Therefore, the problem of a fabricating method being complex along with the miniaturization of a TFT can be solved by reducing the number of reticles using in the fabricating steps.

25 Claims, 10 Drawing Sheets

U.S. PATENT DOCUMENTS

| | | | |
|---|---|---|---|
| 6,387,820 B1 | 5/2002 | Sanderfer | 438/725 |
| 6,403,406 B1 | 6/2002 | Lee et al. | 438/153 |
| 6,833,327 B1 * | 12/2004 | Ishikawa | 438/725 |
| 2001/0008781 A1 | 7/2001 | Lee et al. | 438/153 |

FOREIGN PATENT DOCUMENTS

| | | |
|---|---|---|
| JP | 7-263696 | 10/1995 |
| JP | 2000-031496 | 1/2000 |
| JP | 2000-349297 | 12/2000 |
| JP | 2002-094074 | 3/2002 |
| JP | 3377184 | 12/2002 |

* cited by examiner

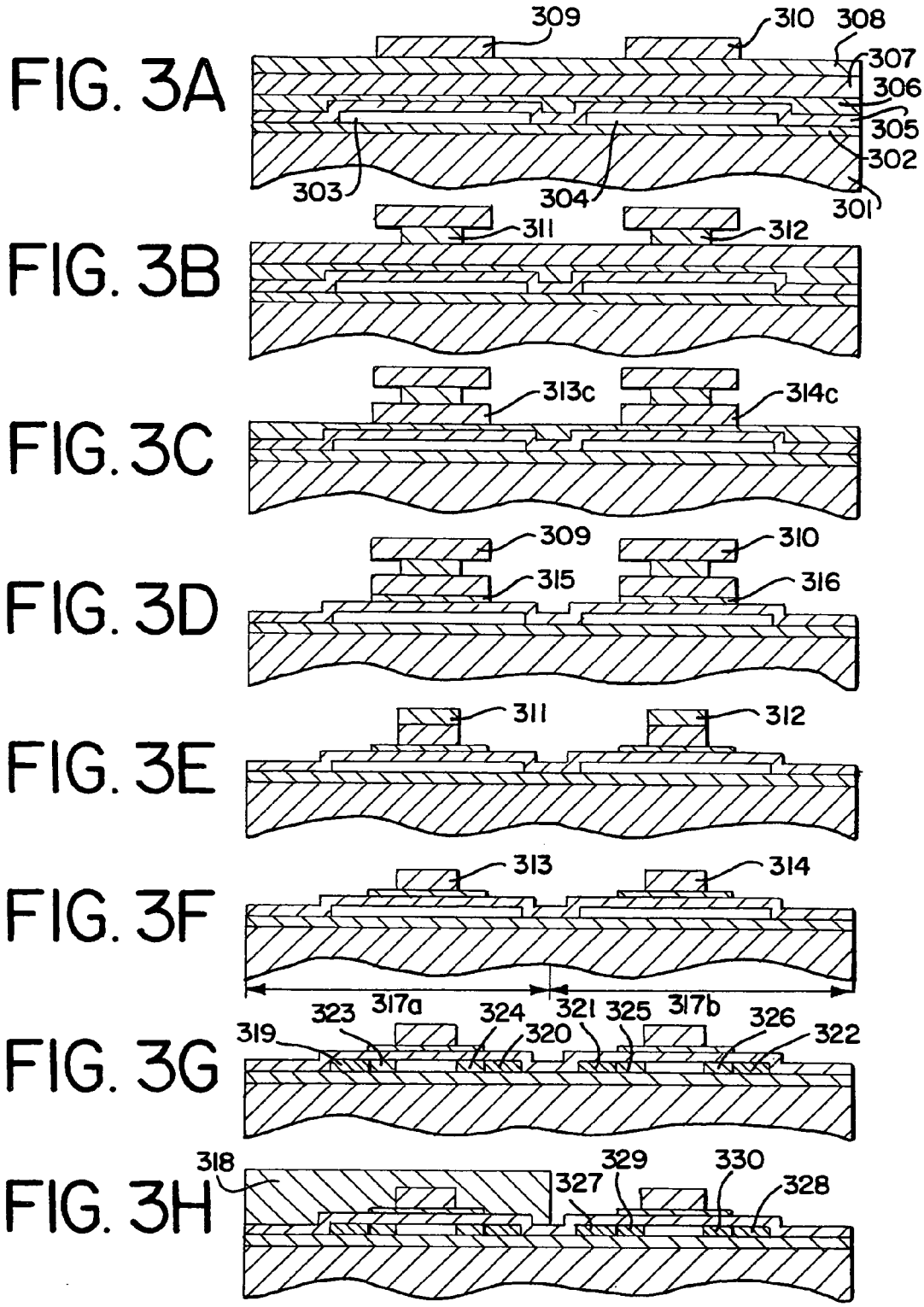

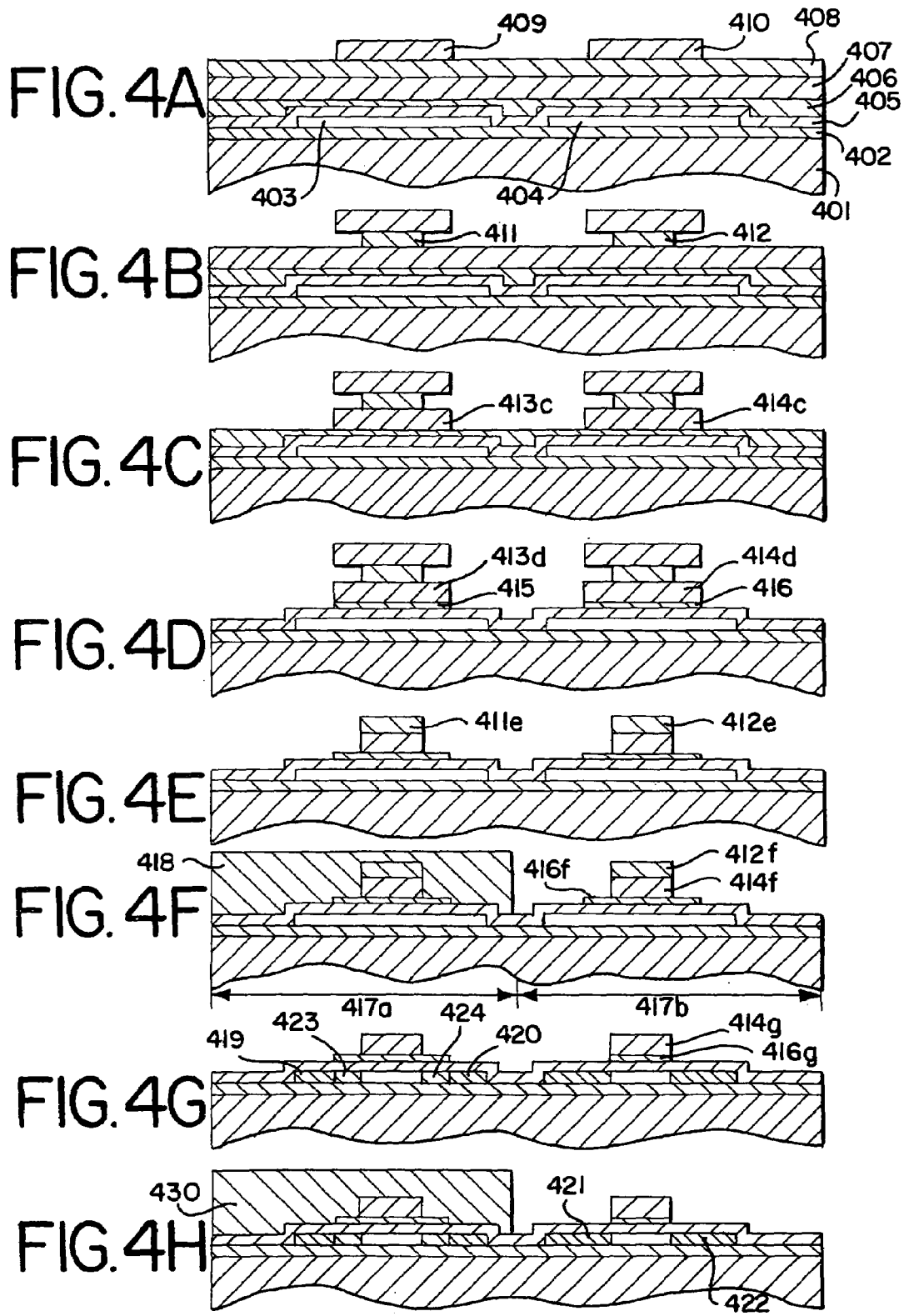

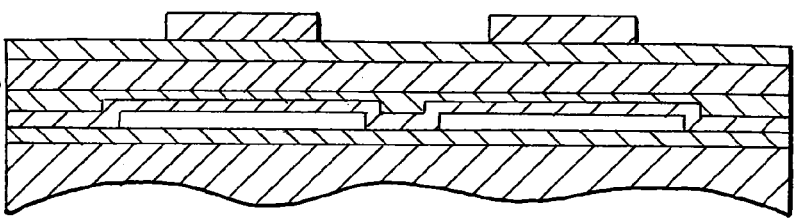
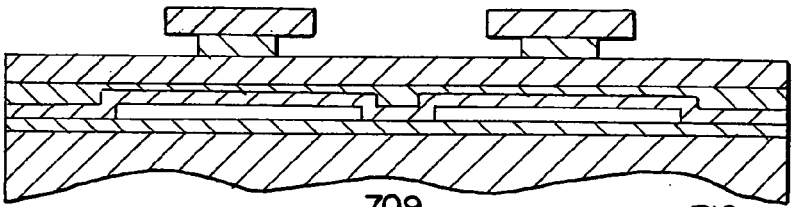
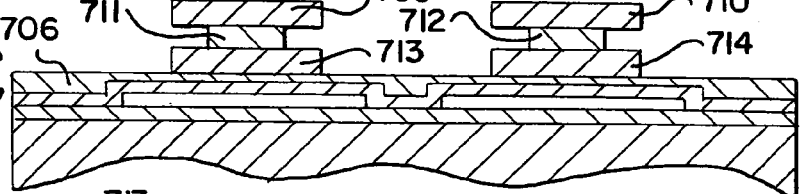
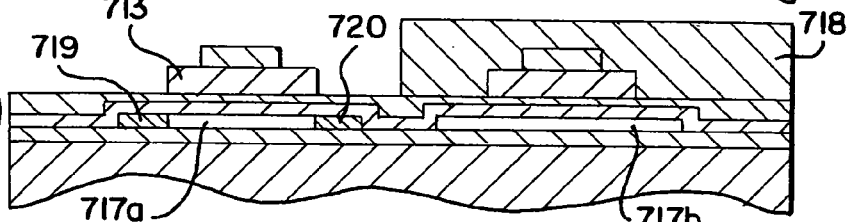
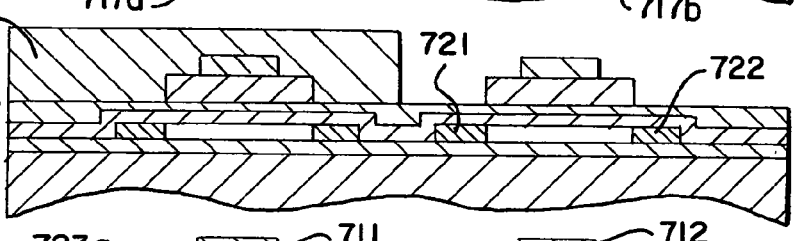
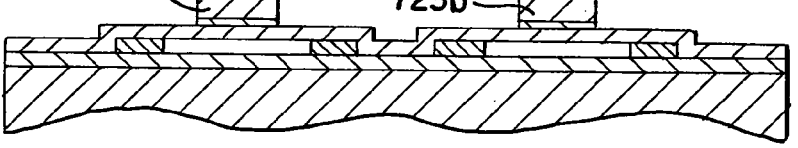
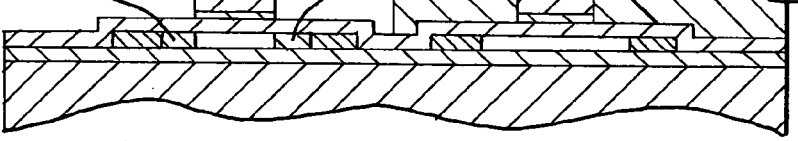
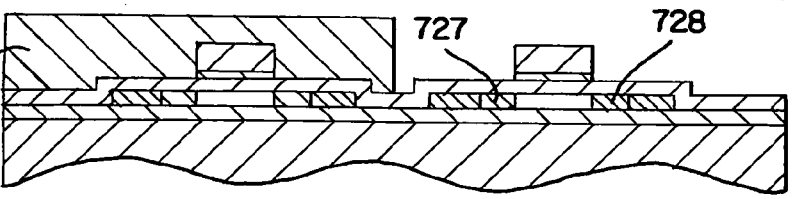

METHOD OF FABRICATING SEMICONDUCTOR DEVICE

This application is a continuation of U.S. application Ser. No. 10/434,012, filed on May 8, 2003 now U.S. Pat. No. 6,833,327.

BACKGROUND OF THE INVENTION

1. Field of the Invention

The present invention relates to a method of fabricating a semiconductor device having a circuit consisted of a thin film transistor (hereinafter, abbreviated as TFT), and particularly, relates to a method of forming a mask in an exposure step and a method of etching using the relevant mask.

2. Description of Related Art

In recent years, an active matrix type liquid crystal display utilizing a TFT has attracted a great deal of attention. An active matrix type liquid crystal display is provided with a TFT as a switching element at each pixel.

In general, in a TFT, a channel formation region is formed with an amorphous silicon or a polycrystalline silicon. Particularly, since a TFT using a polycrystalline silicon which is fabricated particularly at a temperature of being equal to 600° C. or less (referred to as low temperature process) (hereinafter, referred to as polycrystalline silicon TFT) is capable of being formed on a glass substrate, it becomes possible to lower the cost of a semiconductor device and make the area of it larger. Moreover, in the case of a polycrystalline silicon, since the mobility of it is large, it is possible to realize a liquid crystal display in which a pixel section and a driver are integrally formed on a glass substrate.

However, if a polycrystalline silicon TFT is continuously driven, the mobility may be changed, ON-state current (current flowing in the case where a TFT is in an ON-state) may be increased, and OFF-state current (current flowing in the case where a TFT is in an OFF-state) may be increased. It is considered that this may be caused by the deterioration due to a hot carrier occurred by a high electric field nearby a drain.

In order to relax the high electric field nearby the drain and suppress the hot carrier, in the case of a MOS transistor employing the design rule of 1.5 μm or less in a gate line width, it is useful to utilize a LDD (abbreviated from Lightly Doped Drain).

For example in the case of a NMOS (n-type MOSFET) transistor, a LDD structure can be formed by providing a low concentration n-type region (n⁻ region) at the edge portion of the drain utilizing a side wall of the gate side wall. The electric field nearby the drain can be relaxed by employing a LDD structure in which a concentration of impurity of drain junction is made hold a gradient.

In a LDD structure, a drain breakdown voltage can be enhanced comparing to a single drain structure. However, since the resistance of the n⁻ region is large, there is a difficulty that a drain current is reduced. Moreover, since a high electric field exists immediately under the side wall, where the ionization of collision becomes the maximum, and a hot electron is injected into a side wall, the n⁻ region is depleted, and further the resistance is increased, and finally a TFT is made deteriorated.

Particularly, the above-described problem becomes significant according to the reduction of the length of a channel. In order to overcome this problem in the case of a MOS transistor whose design rule is 0.5 μm or less, a Gate Overlap LDD structure which forms the n⁻ region by overlapping at the edge portion of a gate electrode is useful.

Then, the employment of a Gate Overlap LDD structure has been considered in order to relax the high electric field nearby the drain not only in a MOS transistor but also in a polycrystalline silicon TFT. As for a polycrystalline silicon TFT having a Gate Overlap LDD structure, in a polycrystalline silicon layer, a channel formation region, a source region and a drain region which are high concentration regions (n⁺ region), and a low concentration region (n region) which has been provided between the channel formation region and the source and drain regions and which is overlapped with a gate electrode are formed.

As a method of fabricating these structures, there have been reports described in the patent document 1, the patent document 2 and the like.

Patent document 1: Japanese Unexamined Patent Publication No.2000-349297 gazette, and Patent document 2: Japanese Unexamined Patent Publication No. H07-202210 gazette.

PROBLEMS TO BE SOLVED BY THE INVENTION

In the step of fabricating a TFT having a Gate Overlap LDD structure, in order to form a low concentration region (n⁻ region) which is overlapped with a gate electrode, it is necessary to perform the step of adding an impurity element before the formation of a gate electrode, or to add an impurity element so that the impurity element penetrates through the gate electrode.

In the case of the former method, it is necessary to utilize a mask for adding an impurity element and a mask for forming a gate electrode in the separate exposure steps. Therefore, the gate electrode and the n⁻ region cannot be formed in a self-aligned process, the number of masks cannot be suppressed.

On the other hand, in the case of the latter method, it is necessary to add an impurity element only to the n region after a strategy has been taken so that the impurity is not added to the channel region. Therefore, in the case where the addition of an impurity to the channel region is prevented by utilizing the gate electrode itself as a mask, it is necessary to contrive the shape of the gate electrode by thickening the gate electrode only on the channel region and so forth.

However, in order to prevent the addition of the impurity to the channel region by contriving the shape of the gate electrode, in general, the exposure step is necessarily required multiple times. Therefore, it is difficult to precisely control the shape of the gate electrode by a mask shift in the respective exposure steps, the n⁻ region cannot be formed in a self-aligned process. Moreover, the number of reticles to be used is increased, and the fabrication steps become complex.

Moreover, usually, the larger the size of the resist mask becomes, the more the restraint of the conditions concerning with the patterning such as depth of focus, resist film thickness uniformity and the like becomes moderate, therefore, the process margin of the patterning step becomes larger. However, in the conventional methods, since the size and the shape of the resist mask are almost the same with the design sizes of the pattern, the more the miniaturization is progressed, the more the process margin of the patterning process is reduced, and it becomes difficult to fabricate a TFT.

For example, in the patent document 1, a method has been disclosed, in which a gate electrode having a two-layer structure is used, the step of etching a gate electrode is provided twice, and what is called a hut shape gate in which the first layer of the gate electrode is longer than the second layer in a channel length direction, is formed. Moreover, in Japanese Unexamined Patent Publication No.H07-202210 gazette, an example of a method of forming a hut shape gate in a self-aligned process has been described. A method has been described, in which the first layer of a gate electrode comprising titanium or a titanium nitride film and the second layer of a gate electrode comprising aluminum or an aluminum alloy film are formed by a DC (Direct Current) sputtering method. Subsequently, after both the first and second layers of the gate electrode have been etched by an etching treatment, only the gate electrode of the second layer is set back and processed by a side etching.

Moreover, in the technology disclosed in the patent document 2, since aluminum is used for the second layer of the gate electrode, which is different from the gate electrode such as a polycrystalline silicon having an excellent heat resistance, in the heat treatment at a high temperature, the failure due to the aluminum spike and the migration occur, there is a problem that the control of temperature is very difficult. Therefore, it is necessary to perform the activation of the impurity at a temperature at which aluminum is not denatured. However, the activation treatment after the ion injection or the ion doping is performed at a temperature between 550–800° C., therefore, it is difficult to completely perform the activation treatment of the impurity at a temperature lower than that. Except for these, there are problems that in the case where aluminum is used, the surface becomes in a wavy state because aluminum is re-crystallized at a low temperature, or since it is a soft metal, it tends to be subjected to the mechanical damage.

Due to the reasons described above, it has been difficult to fabricate a TFT having a Gate Overlap LDD structure within the design rule in which the channel length is made in the range from about 1 to about 2 µm, the overlapping width of the LDD region with an gate electrode is made 0.5 µm or less. Specifically, a method of fabricating a conventional Gate Overlap LDD structure has problems as the followings:

1) The method requires the photolithography step multiple times,
2) the more the miniaturization is progressed, the more the process margin of the patterning step is reduced, and the fabrication becomes difficult, and
3) as the invention described in Japanese Unexamined Patent Publication No.H07-202210, in a method of fabricating a hut shape gate electrode by performing the patterning once, it has such a variety of problems that it is not preferable that the second layer of the gate electrode is limited to an aluminum film or an aluminum alloy film and the like.

SUMMARY OF THE INVENTION

An object of the present invention is to solve the above-described problems. Concretely, an object of the present invention is to suppress the number of photolithography steps and to provide a technology capable of fabricating the relevant TFT with an excellent precision even if the design rule is miniaturized in a step of fabricating a TFT having a Gate Overlap LDD structure.

It will be described of means for solving the problems such as the necessity of the photolithography step performing multiple times accompanying with the formation of a Gate Overlap LDD structure in a self-aligned process, the diminishing of a margin of the patterning and the reducing number of options for gate materials and the like in a process in which the miniaturization has been progressed.

It should be noted that in the present specification, the following definition is provided in order to clearly describe methods of fabricating a Gate Overlap LDD structure and the like. The region that is not overlapped with the gate electrode out of the LDD region is defined as a "Loff region", and the region that is overlapped with the gate electrode out of the LDD region is defined as a "Lov region". The length of the Loff region is defined as "Loff", and the length of the Lov region is defined as "Lov" and the length of the channel region is defined as "Li". Moreover, in the present specification, as far as it is not clearly described, Lov regions whose lengths are equal to "Lov" are defined to exist on both sides of the channel region, and then, the total length of the channel region and the Lov regions, specifically, the width "L'" of the entire gate electrode on the active layer is defined by the equation of "L'=Li+Lov×2".

Moreover, in the etching step and the doping step in the case where a LSI (Large Scale Integrated circuit) and a TFT (Thin Film Transistor) are fabricated, usually, the pretreatment for forming a protective film on a portion to which the etching treatment and the doping treatment are not performed is carried out. As for the foregoing method of forming a protective film, a method of forming it by projecting the pattern of a photomask on the substrate on which a photo resist has been coated is a type used in usual cases. Therefore, in the following explanation, the relevant protective film is defined as a "mask", and the photomask is defined as a "reticle". It should be noted that a mask might be formed using a material except for the photo resist. Moreover, a mask that has been formed by utilizing the photo resist being as a material is defined as a "resist mask", and the mask that has been formed by utilizing the materials except for the photo resist is defined as a "hard mask".

The present invention fabricates the hut shape gate itself in a self-aligned process by forming a two-layer structure mask pattern as means for solving the above-described problems and by utilizing it.

The present invention is mainly configured by the mask pattern formation step and the gate formation step, hereinafter, the mask formation step and the gate formation step will be described in detail. Now, in order to discriminate the respective masks, the following definitions are provided: a mask for covering the total region of the channel formation region and the Lov region which is used in the case where a Gate Overlap LDD structure is formed is defined as a "Gate Overlap LDD gate mask". A mask for covering the channel region when the gate electrode on the Lov region is made thin is defined as a "channel mask". The channel mask is also used in the case where a gate for a transistor having the Loff region is formed. Moreover, in the case where a Gate Overlap LDD structure is formed, it is necessary to carry out an etching for completely removing the gate material of a portion which is not covered with the Gate Overlap LDD gate mask, and the etching for making the gate electrode on the Lov region thin by utilizing the channel mask. The former is defined as a "Gate Overlap LDD gate etching", and the latter is defined as a "Lov region etching".

The mask formation step is shown in FIG. 8A. An active layer 809 is formed on a substrate 808, and a gate electrode film of the first layer 811a and a gate electrode film of the second layer 811b are formed via a gate insulator film 810. Subsequently, as the preparation for a mask formation, a layer which is to be a material used for a mask is formed. Since in a usual mask formation step, a resist mask is formed only by performing the patterning, that is, only the resist is coated, however, in FIG. 8, a hard mask layer 812 is formed while it is in contact with the gate electrode film of the second layer 811b, and subsequently, a resist 813 is coated while it is in contact with the hard mask layer.

In FIG. 8B, the process for forming a resist mask 815 and a hard mask 814 is shown, that is, how the hard mask (Al) 814 is formed by performing the isotropic etching represented by a wet etching after the resist mask 815 has been formed by performing the usual patterning is shown. In FIG. 8B, the resist mask 815 which is an upper layer is formed as a Gate Overlap LDD gate mask by the usual patterning. The hard mask 814 which is a lower layer is formed as a channel mask by performing the isotropic etching represented by a wet etching utilizing a resist mask which is an upper layer. Moreover, the isotropic etching can be controlled by the setback amount of the hard mask with respect to the resist mask (amount of side etching), that is to say, the Lov can be controlled by the thickness of the hard mask layer. In the case where Lov is made large, the hard mask layer may be formed as being thick, and in the case where Lov is made small, the hard mask layer may be formed as being thin. Or, the setback amount can be controlled by making the hard mask in a certain thickness, and by controlling the over-etching time. It should be noted that in the case where it is formed by performing the wet etching, it is not necessary to consider the problems such as a corrosion, a film remaining defect and the like when the hard mask is formed.

As for a material for this hard mask, a material satisfying the two conditions of which an isotropic etching whose etching selectivity with the gate electrode is high is capable of being carried out and the etching selectivity is high in such a degree that it can be used as a mask when the Lov region is etched can be freely selected. If the side etching is essential when it is etched using the hard mask, since an air-gap is necessarily formed under the hard mask, in the later step and it can be a causing factor of the inconvenience, it is essential to remove the hard mask after the etching. However, in the present invention, as described later when the gate formation step is described, the side etching is not essential when the etching is performed using the hard mask. Therefore, in the present invention, the step of removing the hard mask after the etching is not necessarily essential. Moreover, in a process for removing the hard mask after the etching, in the case where the gate insulator film is in an uncovered condition when the hard mask is removed, the condition that "an etching whose etching selectivity is high with the gate insulator film is capable of being carried out" should be added in relation with the hard mask material. In the present invention, since the process for making the hard mask remained without removing the hard mask is capable of being carried out, the range for selective options for the hard mask materials is widened. As a process for making the hard mask remained without removing the hard mask, for example, a process in which a silicon oxide film is selected as a hard mask material and the hard mask is made remain as a portion of the inter interlayer insulating film is listed. Moreover, in the case where as a hard mask material, a refractory metal has been selected, it is possible to make the hard mask remain as a portion of the gate electrode.

In this way, the mask pattern of the first layer (pattern of hard mask) can be formed in a self-aligned process and as a mask pattern which is analog and different in size with respect to the mask pattern of the second layer (pattern of resist mask) by performing the photolithography step only once. It is easy that the line width on the active layer is set so as to be Li in the case of the mask pattern of the first layer, and so as to be L' in the case of the mask pattern of the second layer. Although in the conventional method, the pattern of Li must be also fabricated by the resist mask, if a method according to the present invention is used, the line width of the resist mask on the active layer becomes Li+Lov×2, since it can be set larger than the conventional ones, it is possible to further deal with the miniaturization.

Moreover, even if the mask pattern of the second layer which is a resist mask is peeled off, the mask pattern of the first layer which is a hard mask remains. Therefore, the anisotropic etching using the mask pattern of the second layer and the anisotropic etching using the mask pattern of the first layer can be in turn performed. Since the mask pattern of the first layer and the mask pattern of the second layer are analog and formed as mask patterns which are different in their sizes, a hut shape gate can be formed in a self-aligned process by in turn carrying out the etchings using these mask patterns. In this way, the number of reticles used in the fabricating steps is reduced, and the problems which make the fabricating method complex accompanying with the miniaturization of a TFT can be solved.

The gate formation step which is one of the main sections of the present invention will be described below. The etching using a mask having a laminated structure comprising a resist mask 916 and a hard mask 917 is carried out by dividing into 2 stages (see FIG. 9A and FIG. 9B). In FIG. 9A, how a gate electrode film of the second layer 918 is anisotropically dry-etched is shown. In FIG. 9B, how a gate electrode film of the first layer 919 is anisotropically dry-etched is shown. In the etching of the first stage, the etching of the Gate Overlap LDD gate is carried out by utilizing the resist mask 916 corresponding to the Gate Overlap LDD gate mask. It is desirable that the etching of the Gate Overlap LDD gate is carried out by performing the complete aniso-tropic etching. Specifically, the portions of the gate electrode film of the first layer 918 and the gate electrode film of the second layer 919 which are not covered by the Gate Overlap LDD gate mask are completely removed. As a result of this, an electrically conductive layer having the first shape 920 is formed. Subsequently, a resist mask 916 is peeled off, and the hard mask 917 is exposed (FIG. 9C).

As for an etching of the second stage, the etching (Lov region etching) which makes the gate electrode located on the Lov region into a thin film is carried out using a hard mask corresponding to the channel mask. In FIG. 10A, how only a gate electrode film of the second layer 1024 is anisotropically dry-etched by utilizing a hard mask 1023 as a mask is shown. Subsequently, the hard mask 1023 is removed by carrying out the isotropic etching represented by a wet etching (see FIG. 10B). As described above up to this point, an electrically conductive layer 1026 having the second shape which is a hut shape gate is formed in a self-aligned process. Subsequently, the impurity is added to the source and drain regions in a high concentration, and the impurity is added to the Lov region in a low concentration.

In this way, a mask having a structure in which a resist mask is laminated on the hard mask referred to as a major part of the present invention is utilized, in the case of a hard mask, it is set so as to be Li, and in the case of a resist mask, it is set so as to be L', and a hut shape gate can be formed in a self-aligned process by in turn carrying out the aniso-tropic etching using a resist mask and the anisotropic etching using a hard mask. Therefore, the number of reticles used in the fabricating steps is reduced and the problems which make the fabricating method complex accompanying with the miniaturization of a TFT can be solved.

In the explanation described above, the electrically con-ductive film which is to be a gate electrode has been a two-layer structure composed of different materials. Owing to this, it is possible that the electrically conductive layer of the first layer (lower layer) is made an etching stopper when the electrically conductive layer of the second layer (upper layer) is etched. In this way, the range of the selective options of the conditions in which the electrically conductive film which is to be a gate electrode is etched can be enlarged. The effect is large particularly when the Lov region is etched, and it can make the gate film thickness precisely controlled and as a result of this, the concentration of the impurities which is added to the Lov region in the later step can be easily controlled.

Moreover, if the present invention is applied, a pretty large number of combinations of the first electrically conductive film and the second electrically conductive film which configure a hut shape gate can be selected, and the second electrically conductive film is not limited to an aluminum film. The above-described first and second electrically conductive films may be formed with an element selected from Ta (tantalum), W (tungsten), Ti (titanium), Mo (molybdenum), Al (aluminum), and Cu (copper) or an alloy material or compound whose main component is the foregoing element. Moreover, a semiconductor represented by a polycrystalline silicon film to which an impurity element such as phosphorus or the like has been doped may be used. Moreover, the combination of the first electrically conductive film being formed with a tantalum (Ta) film and the second electrically conductive film being made with tungsten (W) may be used, and the combination of the first electrically conductive film being formed with tantalum nitride (TaN) film and the second electrically conductive film being made with copper (Cu) film may be used. Since a refractory metal can be selected as a gate material, the activation of an impurity can be carried out by a usual thermal treatment (550–800° C.).

However, it is not an essential condition that the gate electrode film is configured with two layers. If the etching of the Lov region is precisely controlled, it is also possible to configure the gate electrode film with a single layer film. Even if the gate electrode film is configured with a single layer film, a hut shape gate is capable of being formed by the application of the present invention.

Moreover, as the typical values, Li=1.0–2.0 μm, and Lov=0.25–0.5 μm are listed. However, these values are not necessarily limited to these ranges.

According to a fabricating method of the present invention, a mask (hard mask) of the first layer can be formed in a self-aligned process and as a mask pattern which is analog, but which is different in size with respect to a mask of the second layer (resist mask) by carrying out the photolithography step only once. A TFT having only the Loff region can be formed in a self-aligned process by setting the line width on the activation layer so as to be Li in the mask patter of the first layer and so as to be Li+Loff×2 in the mask pattern of the second layer, and by in turn carrying out the anisotropic etching using the mask pattern of the second layer and the anisotropic etching using the mask pattern of the first layer. Therefore, the number of reticles used in the fabricating step is reduced, and the problem of the complexity of the fabricating method accompanying with the miniaturization of a TFT can be solved. Moreover, since a single-layer electrically conductive film or a laminated electrically conductive film, which is to be a material for the gate electrode can be optionally selected from the large number of materials without being limited to aluminum, the activation of an impurity can be carried out by a usual thermal treatment (550–800° C.).

Moreover, as the typical values, Li=1.0–2.0 m, and Loff=0.25–0.5 μm are listed. However, these values are not limited to these ranges. Owing to these, even if it is a process for fabricating a TFT having only the Loff region whose miniaturization has been progressed, the line width of the resist mask located on the active layer is not miniaturized, but the patterning margin can be enlarged.

Moreover, the hard mask may be formed by a wet etching treatment using a resist mask. Owing to this, in a process of fabricating a TFT having only the Loff region whose miniaturization has been progressed, the problems such as the dispersion of the film thickness and the occurrences of the irregularity of etching, corrosion, the film remaining defect and the like can be prevented.

It should be noted that a p-channel type TFT might be made a Gate Overlap LDD structure, or a n-channel type TFT might be made a Gate Overlap LDD structure. Moreover, both of them may be made a Gate Overlap LDD structure.

BRIEF DESCRIPTION OF THE DRAWINGS

FIG. 3 is a diagram showing a method of fabricating a CMOS circuit according to the present invention;

FIG. 4 is a diagram showing the first method of fabricating a TFT having a Gate Overlap LDD structure and a TFT having a single drain structure being made mixed according to the present invention;

FIG. 7 is a diagram showing a method of fabricating a TFT having only Loff region according to the present invention;

PREFERRED EMBODIMENTS OF THE INVENTION

Embodiment 1

Figure 1A:
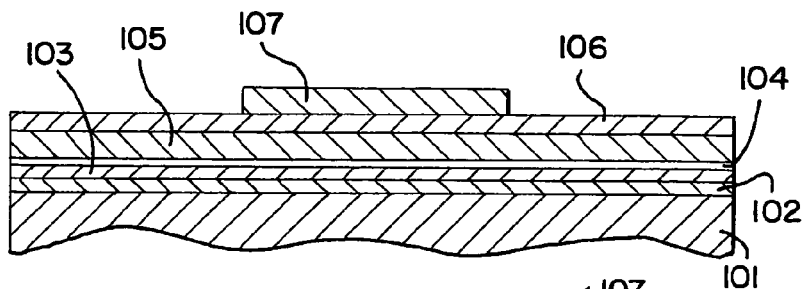
FIG. 1 is a diagram showing a method of fabricating a TFT having a Gate Overlap LDD structure according to the present invention.
Figure 1B:
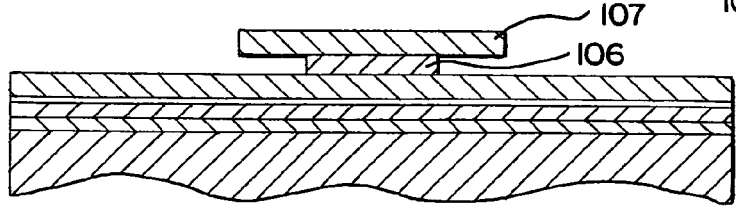
Figure 1C:
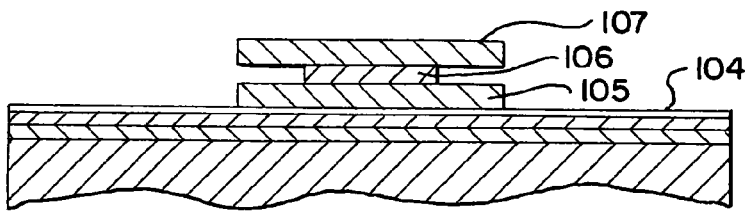

First, one Embodiment of FIG. 1 pertaining to a fabricating method of a TFT having a Gate Overlap LDD structure will be described below. A silicon layer 102 is formed on a substrate 101, a gate insulator film 103 is deposited on the silicon layer, and next, as a first electrically conductive film and a second electrically conductive film, a gate electrode film of the first layer 104 and a gate electrode film of the second layer 105 are laminated. Subsequently, a hard mask layer 106 is formed. Next, a resist mask 107 is formed by performing the patterning (see FIG. 1A). Then, an isotropic etching treatment is carried out by a wet etching using the foregoing resist mask 107, and a hard mask 106 is formed (see FIG. 1B) Next, only the gate electrode film of the second layer 105 is anisotropically dry-etched using the foregoing resist mask 107, that is, a Gate Overlap LDD gate mask (see FIG. 1C).

Figure 1D:
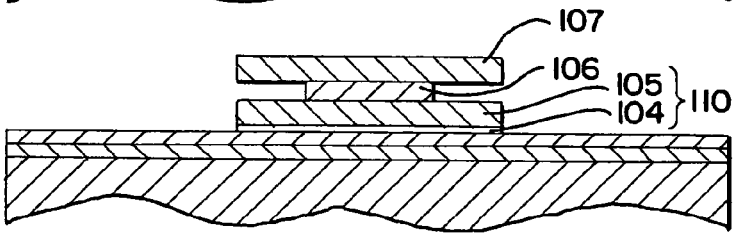
Figure 1E:
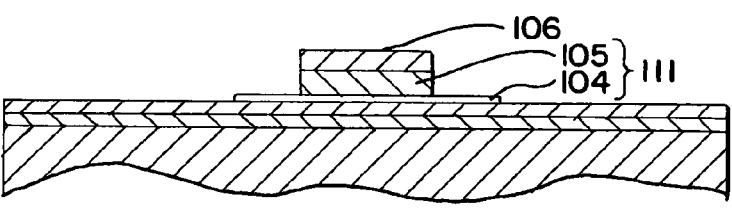

Next, the gate electrode film of the first layer 104 is anisotropically dry-etched under the different conditions by utilizing the foregoing resist mask 107 and the foregoing gate electrode film of the second layer 105 as a mask, and an electrically conductive layer having the first shape is formed (see FIG. 1D). Then, the resist mask 107 is peeled off and the hard mask 106 is made exposed.

Subsequently, the foregoing gate electrode film of the second layer 105 is anisotropically dry-etched by utilizing the foregoing gate electrode film of the first layer 104 as an etching stopper using the hard mask 106, and only the foregoing gate electrode film of the first layer 104 is made remain in the Lov region. In this way, an electrically conductive layer 111 having the second shape is formed (see FIG. 1E).

Figure 1F:
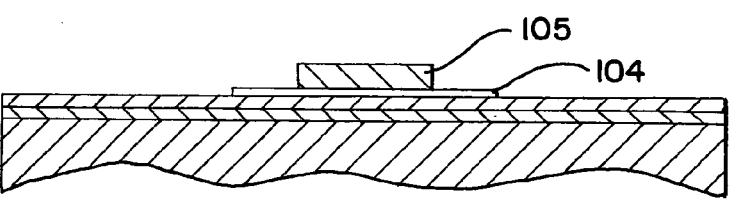
Figure 1G:
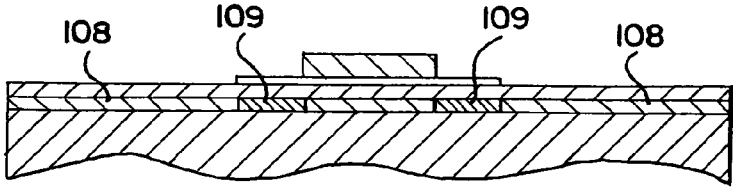

Next, the hard mask 106 is removed by a wet etching (see FIG. 1F). In this way, a hut shape gate is formed in a self-aligned process. Subsequently, the high concentration impurity is added, a first impurity region 108 which is to be a source region and a drain region is formed outside of the electrically conductive layer having the first shape. Subsequently, a second impurity region 109 which is overlapped with the electrically conductive layer having the second shape is formed by adding a low concentration impurity. The second impurity region 109 corresponds to the Lov region (see FIG. 1G).

Subsequently, a TFT is completed via the step of forming an inter interlayer insulating film, the step of activation, the step of forming a contact hole, the step of forming a wiring. These steps are not shown.

It should be noted that the addition of the impurities to the first impurity region 108 which is to be a source region and a drain region can be carried out after the electrically conductive layer 110 having the first shape is formed (FIG. 1D or state where a resist mask has been removed from FIG. 1D). In this case, since the gate electrode film of the first layer 104 and the gate electrode film of the second layer 105 are masks for the Lov region, the limitation of the addition of impurities to the first impurity region 108 is relaxed.

Embodiment 2

The invention described in the present Embodiment is characterized in that in the formation of the TFT having the Loff region, the line width of the hard mask can be formed smaller than the line width of the resist mask by forming a mask having a laminated structure consisted of a hard mask and a resist mask in a self-aligned process by a wet etching, and the patterning margin in a process in which the miniaturization has been progressed can be enlarged. Embodiment pertaining to a method of fabricating a TFT having the Loff region of the present invention will be described below.

A method of forming a Gate Overlap LDD structure in a self-aligned process described in Embodiment 1 can be modified into a method of forming a TFT structure having only the Loff region in a self-aligned process by adding the modifications of three points described below.

(Modification 1): A step of adding impurities to the source and drain regions between the step of etching Gate Overlap LDD gate and the step of etching the Lov region is added.

(Modification 2): Upon etching the Lov region, the etching conditions are modified into etching conditions under which not only gate upper layer (tungsten; W) but also the gate lower layer (tantalum nitride; TaN) is removed by an anisotropic etching.

(Modification 3): After the Lov region has been etched, or after the hard mask has been removed, the step of adding impurities to the LDD is added.

Now, one Embodiment of FIG. 2 pertaining to a method of fabricating a TFT having a Loff region will be described below. Since basically, the fabricating method from the resist mask pattern step to the step of etching only gate electrode film of the second layer, that is, from the FIG. 2A to FIG. 2D is the same with the invention of FIG. 1, the steps up to this step are omitted and the explanation will be described from the steps starting from the step of peeling off the resist mask. Then, a resist mask 207 is peeled off, and a hard mask 206 is exposed. Subsequently, the impurity is added. In the present Embodiment, since the gate electrode film of the first layer 204 has been remained in the source and drain regions, the impurities are added via the gate electrode film of the first layer 204 and the gate insulator film 203. In the case where the films up to the gate electrode film of the first layer 204 has been removed by carrying out the etching using a gate Loff mask, the impurity is added by penetrating through only the gate insulator film 203. However, since the Loff region is masked with the second electrically conductive film region 205 consisted of the foregoing gate electrode film of the first layer 204 and the foregoing gate electrode film of the second layer, the impurity is not added at all. Owing to this, only the source and drain regions become high concentration impurity regions, and the first impurity regions 208, 209 are formed (see FIG. 2D).

Subsequently, only the foregoing electrically conductive region of the second layer 205 is anisotrocally dry-etched using the hard mask 206 by utilizing the foregoing gate electrode film of the first layer 204 as an etching stopper, and further, only the foregoing gate electrode film of the first layer 204 is anisotropically dry-etched. In this way, the foregoing gate electrode film of the first layer 204 and the foregoing second electrically conductive film region 205 located in the Loff region are completely removed (see FIG. 2E). As a result, an electrically conductive layer 210 having the first shape is formed.

Figure 2A:
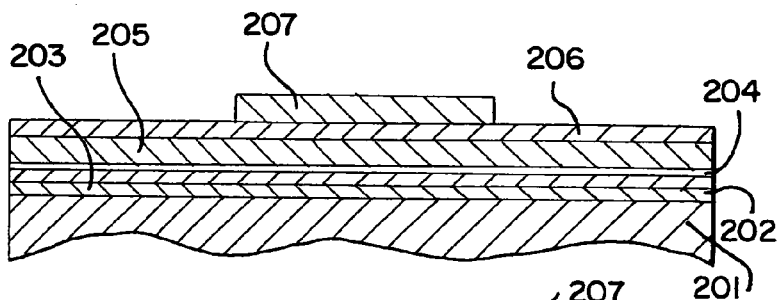
FIG. 2 is a diagram showing a method of fabricating a TFT only having a Loff region according to the present invention.
Figure 2B:
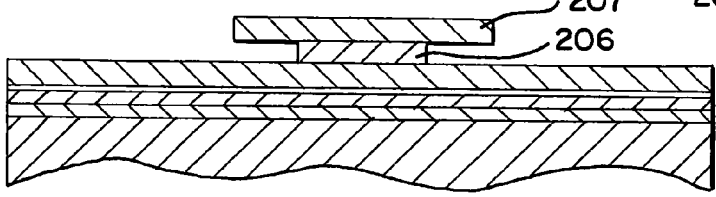
Figure 2C:
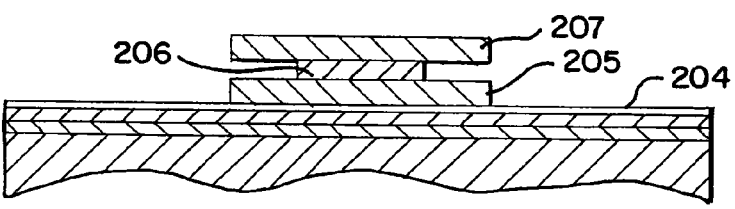
Figure 2D:
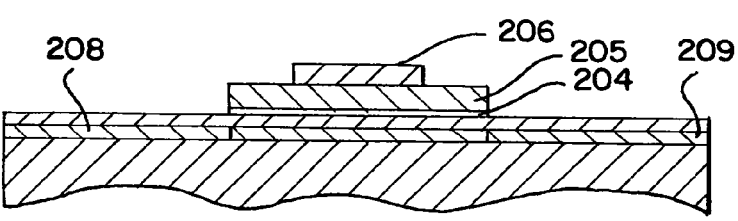
Figure 2E:
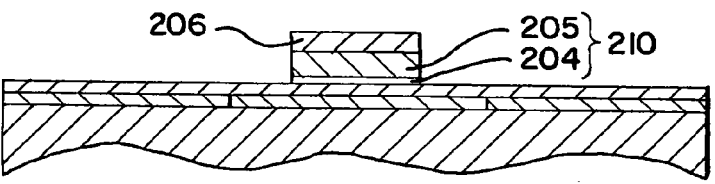
Figure 2F:
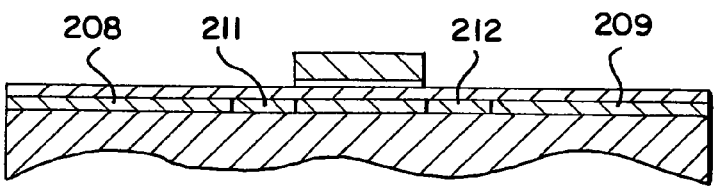

Next, the hard mask 206 is removed by a wet etching (see FIG. 2F). Subsequently, the impurities are added to the Loff region and the source and drain regions. The impurities are added by penetrating through the gate insulator film. In this way, since the source and drain regions become first impurity regions 208, 209 which are to be high concentration impurity regions. The Loff regions become the second impurity regions 211, 212 which are to be low concentration impurity regions (see FIG. 2F). Subsequently, a TFT is completed via the step of forming an inter interlayer insulating film, the step of activation, the step of forming a contact hole, and the step of forming a wiring. The TFT is completed via these steps. These steps are not shown. It should be noted that the removal of the hard mask might be carried out after the impurity has been added to the Loff region.

EXAMPLES

Example 1

A method of fabricating a control circuit using a complementary device combined with two transistors having a Gate Overlap LDD structure, which is Example of the present invention, that is, what is called a CMOS circuit will be described below with reference to FIG. 3.

As a substrate 301, a glass substrate, a quartz substrate, a ceramic substrate, and the like can be used. Moreover, a substrate that an insulator film has been formed on the surface of a silicon substrate, metal substrate or a stainless substrate may be used. Moreover, a plastic substrate having the heat resistance capable of being bearable to the treatment temperature of the present Example may be used.

Subsequently, as shown in FIG. 3A, an under coat film 302 composed of an insulator film such as a silicon oxide film, a silicon nitride film or a silicon oxide nitride film and the like is formed on the substrate 301. Although a single layer film is used as the under coat film 302 in the present Example, a structure in which two or more of the foregoing insulators are laminated may be used. It should be noted that the foregoing under coat film 302 is one for the purpose of preventing the impurity diffusion from the substrate 301 (see FIG. 3A).

Subsequently, an amorphous semiconductor film is formed. An amorphous semiconductor film is formed by the known means (sputtering method, LPCVD method, or plasma CVD method or the like). The thickness of this amorphous semiconductor film is formed in a thickness of 30–60 nm. Although there is not limitation to the materials for an amorphous semiconductor film, preferably, it may be formed with silicon or a silicon germanium (SiGe) alloy or the like (see FIG. 3A). It should be noted that it is not limited to amorphous semiconductor films, a polycrystalline semiconductor film and a microcrystalline semiconductor film and the like may be formed.

Then, dehydrogenation of the amorphous semiconductor film (500° C., one hour) is carried out, and subsequently, a thermal treatment (550° C., four hours) is carried out by a furnace-annealing furnace. If it is necessary, subsequently, a laser annealing may be added. As a crystalline semiconductor film thus obtained being shown in FIG. 3B, crystalline semiconductor layers 303, 304 are formed by patterning it into a desired shape by means of the photolithography step and the etching step (see FIG. 3A).

Next, a gate insulator film 305 for covering the semiconductor layers 303, 304 is formed. The gate insulator film 305 is formed by a plasma CVD method and a sputtering method, and formed with an insulator film containing silicon by making its thickness as in the range from 40 to 150 nm. The gate insulator film is not limited to silicon oxide nitride films, and it may be other insulating films containing silicon in a single layer or a laminated structure (see FIG. 3A).

Subsequently, a gate electrically conductive film is formed on the gate insulator film 305. In the present Example, a gate electrode film of the first layer 306 (TaN) for the first electrically conductive film having a film thickness of 20–100 nm and a gate electrode film of the second layer 307 (W) for the second electrically conductive film having a film thickness of 100–400 nm are laminated and formed into a layer. The gate electrically conductive film may be formed with an element selected from Ta (tantalum), W (tungsten), Ti (titanium), Mo (molybdenum), Al (aluminum), and Cu (copper) or an alloy material or compound whose main component is the foregoing element. Moreover, a semiconductor film represented by a polycrystalline silicon film to which impurity elements such as phosphorus and the like have been doped may be used. Moreover, the combination of the gate electrode film of the first layer being formed with tantalum (Ta) film, and the gate electrode film of the second layer being made tungsten (W) film or the combination of the gate electrode film of the first layer being formed with tantalum nitride (TaN) film and the gate electrode film of the second layer being made copper (Cu) film may be used (see FIG. 3A).

Subsequently, in the step of etching a gate electrode described later, a hard mask layer 308 (Al) which is to be an etching mask is formed. In the present Embodiment, a material of the hard mask is made aluminum (Al), however, it is not necessary to limit the material of the hard mask only to aluminum (Al). The material for the hard mask can be freely selected from the materials satisfying the two conditions that "the isotropic etching whose etching selectivity is high with the gate electrode is capable of being carried out" and "the etching selectivity is sufficiently high to the degree that it can be used as a mask when the Lov region is etched". For example, an ITO (Indium Tin Oxide) film, an amorphous silicon film or the like may be selected. The thickness of the hard mask will be described later.

Next, resist masks 309, 310 are formed on a hard mask layer 308. Hard masks 311, 312 are formed by a wet etching using the foregoing resist mask (see FIG. 3B). As an etchant, mixed acid such as phosphoric acid, acetic acid, nitric acid and the like are used. Moreover, a hydrochloric acid based aqueous solution may be used. It is necessary to be noted that in a dry-etching, depending upon the conditions, since there is a possibility that carbon based denatured layer is generated on the side wall of the resist mask layer and etching coating film, and a corrosion is generated by reacting this denatured layer, remained $Cl_2$, and water in the air, the state of the surface might be wavy. However, in the present Example, since it is carried out by a wet etching, the corrosion and the like are not necessary to be considered.

In the later step, the foregoing resist masks 309, 310 are used as a Gate Overlap LDD gate mask, and the hard masks 311, 312 which have been formed using the foregoing resist masks 309, 310 are used as a channel mask. Therefore, the edge of the foregoing hard mask should exist at the position set back by the portions of the Lov from the edge of the foregoing resist mask. If the thickness of the hard mask is set as being the same with the width of the Lov, at the time when the etching of the Gate Overlap LDD gate was terminated, the edge of the foregoing hard mask would exist at the position set back by the portion of the Lov from the edge of the foregoing resist mask. Moreover, the width of the Lov is capable of being adjusted by adjusting the over-etching time on the premise that the thickness of the hard mask is set smaller than the Lov.

Next, the etching of the Gate Overlap LDD gate is carried out using the foregoing resist masks 309, 310, that is, the Gate Overlap LDD gate mask, and only the gate electrode film of the second layer 307 is anisotropically dry-etched (etching of the first step) (see FIG. 3C). In the present Example, the gate electrode is configured with two layers of tungsten (W) and tantalum nitride (TaN), since the gate electrode film of the first layer (TaN) functions as an etching stopper at the time when the tungsten (W) film is etched, the gate electrode film of the second layer (W) and the gate electrode film of the first layer (TaN) are etched under the different conditions.

In the present Example, $SF_6$ (sulfur hexafluoride), $Cl_2$, and $O_2$ are used as a gas for etching, the gas flow ratio of the respective gases is made as 24/12/24 (sccm), the etching is carried out by making RF (13.56 MHz) power of 700 W to the coil type electrode under the pressure of 2 Pa and by generating a plasma. On the substrate side (sample stage), RF (13.56 MHz) power of 10 W is made, and the self-biasing voltage which is lower comparing to the first etching treatment is applied. The tungsten (W) film is anisotropically etched under these conditions, and electrically conductive layers 313, 314 having the first shape are formed. At this time, since only the gate electrode film of the second layer 307 (tungsten (W) film) is etched, the gate electrode film of the first layer (TaN) 306 remains without being etched (see FIG. 3C).

Next, the conditions are changed into the second etching conditions, and the gate electrode film of the first layer 306 is anisotropically dry-etched under the different conditions by utilizing the foregoing gate electrode films of the second layers (tungsten (W) film) 311, 314 as a mask (see FIG. 3D). $CF_4$ (carbon tetrafluoride), and $Cl_2$ are used as a gas for etching, the gas flow ratio of the respective gases is made as 30/30 (sccm), the etching is carried out by making RF (13.56 MHz) power of 500 W to the coil type electrode under the pressure of 1.5 Pa and by generating a plasma. Also on the substrate side (sample stage), RF (13.56 MHz) power of 10 W is made, and the self-biasing voltage which is substantially electronegative potential is applied. As a result, the foregoing gate electrode films of the first layer (TaN) 315, 316 are formed.

It should be noted that it is desirable that the etching of the Gate Overlap LDD gate is carried out under the conditions that makes the etching complete anisotropic etching. As for complete isotropic etching, since the gate electrode is etched to the portion underneath the resist mask, it is not desirable. In the case where the etching of the Gate Overlap LDD gate under the conditions that are slightly shifted to the conditions of the isotropic etching, the finished width of the line of the gate electrode is lessened than the line width of the resist mask, however, it can be easily controlled by the known size adjustment technology. For example, the line width of the resist mask is enlarged by the line width lessened by means of modification of the patterning conditions or the patterning on the reticle, and in addition to this, the setback amount at the time when a wet etching is carried out may be adjusted so that the line width of the hard mask is not changed. It may be similarly dealt with the case where the size adjustment is required and so forth because it is short of the etching selectivity with the resist mask.

Then, the resist masks 309, 310 are peeled off, and the hard masks 311, 312 are made exposed.

Subsequently, the etching of the Lov region is carried out using the hard masks 311, 312. The foregoing gate electrode films of the second layer 313, 314 are anisotropically dry-etched by utilizing the foregoing gate electrode films of the first layer 315, 316 as an etching stopper, and only the foregoing gate electrode films of the first layer 315, 316 are made remained in the Lov region (see FIG. 3E). Only the gate electrode film of the second layer is removed by carrying out the anisotropic dry-etching. Moreover, if the size adjustment is required, it may be adjusted similarly to the case where the Gate Overlap LDD gate is etched.

Next, the hard masks 311, 312 are removed by a wet etching (see FIG. 3F). In this way, a hut shape gate is formed in a self-aligned process. It should be noted that although the hard masks are removed in the present Example, these hard masks are not necessarily required to be removed. For example, it is possible that as a hard mask material, a silicon oxide film is selected, and the hard mask is capable of being remained as a portion of the inter interlayer insulating film. As another example, it is possible that as a hard mask material, a refractory metal such as Molybdenum (Mo) or the like is selected, and the hard mask is capable of being remained as a portion of the gate electrode. In the case where the hard mask is not removed, it is desirable that the etching of the Lov region is carried out by a complete anisotropic etching.

Subsequently, the doping treatment is carried out. In the present Example, the case where a semiconductor region 317a of the left side in FIG. 3G (referred to as first region) is made a n-channel type TFT, a semiconductor region 317b of the right side in FIG. 3G (referred to as second region) is made a p-channel type TFT will be described below. Moreover, although in the present Embodiment, the doping treatments are in turn carried out so as to follow the order of the n-channel type TFT and the p-channel type TFT, but this order may be reversed. The first doping treatment is carried out, and the impurity element which gives the n-type to the semiconductor layer is added. The doping treatment may be carried out by an ion doping method, or an ion injection method. For example, as for the conditions of the ion doping method, the dosage is made in the concentration range from $1\times10^{13}$ to $5\times10^{15}$ atoms/cm$^2$, the acceleration voltage is made in the range from 60 to 100 kV (5% $PH_3$, 40 sccm, 60 kv, 5 µA, and 4.0E15) and the doping treatment is carried out. As an impurity element giving n-type, an element belonging to the 15th group of the periodic table, typically, phosphorus (P) or arsenic (As) are used. In this case, the foregoing gate electrode films 315, 316 of the first layer and the foregoing gate electrode films of the second layer 313, 314 become masks against the impurity element which gives the n-type, and the first impurity regions 319–322 are formed by an etching treatment. An impurity element which gives the n-type is added to the first impurity regions 319–322 in the concentration range from $1\times10^{20}$ to $1\times10^{21}$ atoms/cm$^3$. The region is made n$^+$ region (see FIG. 3G).

Subsequently, the second doping treatment is carried out. In this case, the dosage is made lower than that of the first doping treatment, the impurity element which gives the n-type is doped under the high acceleration voltage. For example, the acceleration voltage is made in the range from 70 to 120 kV, in the present Example, the acceleration voltage is made 90 kV, and the doping treatment is carried out in the dosage of $3.5\times10^{12}$ atoms/cm$^2$, a new impurity region is formed in a semiconductor layer located inner side than the first impurity region formed by the first doping treatment. As for (5% $PH_3$, 30 sccm, 90 kv, 0.5 µA, and 1.0E14) doping treatment, the foregoing gate electrode films of the first layer 315, 316 and the foregoing gate electrode films of the second layer 313, 314 are used for the mask against the impurity element, and the doping is carried out so as to add the impurity element also in the semiconductor layer beneath the gate electrode films of the first layer 315, 316 (see FIG. 3G).

In this way, the second impurity regions 323–326 which are overlapped with the gate electrode films of the first layer 315, 316 and the first impurity regions 319–322 are formed. Concentration of the impurity element which gives the n-type is in the range from $1\times10^{17}$ to $1\times10^{19}$ atoms/cm$^3$ in the second impurity regions. The second impurity regions become n region (see FIG. 3G). According to the procedure described above, a n-channel type TFT having a Gate Overlap LDD structure is formed. It should be noted that the first doping treatment might be carried out after the resist mask has been removed, before the etching of the Lov region has been carried out. In this case, since there is no fear that the impurity is added to the Lov region at the time when the first doping treatment is carried out, the range in which the conditions of the first doping treatment can be set is capable of being widened.

Next, the semiconductor region on the left side 317a is covered with a photo resist 318, and under the state, a p-type impurity is doped in the semiconductor region 317b on the right side. The doping treatment is carried out by a similar method with the treatment for forming the above-described n-channel type TFT. Specifically, a high concentration impurity is added by the third doping treatment, the third impurity regions 327, 328 are formed, and the fourth impurity regions 329, 330 to which the impurity of a lower concentration has been added are formed.

In this way, the third impurity regions become $p^+$ regions, the fourth impurity regions become $p^-$ regions. In the present Example, the impurity region is formed by an ion doping method using diborane ($B_2H_6$) (5% $B_2H_6$, 80 sccm, 80 kv, 5 µA, and 2.0E16). Upon the third doping treatment, the semiconductor region 317a in which n-channel type TFT is formed has been covered with the photo resist 318. Although phosphorus is added to the impurity regions 327–330 at the respective different concentrations, there rises no problem for the purpose of functioning as a source region and a drain region of the p-channel type TFT by carrying out the doping treatment so that the concentration of the impurity element giving the p-type is made in the range from $2×10^{20}$ to $2×10^{21}$ atoms/com$^3$ (see FIG. 3H).

According to the procedure described above, a n-channel type TFT having a Gate Overlap LDD structure is formed. It should be noted that a method of fabricating a n-channel type TFT and a p-channel type TFT by a method in which any one of a n-channel type TFT and a p-channel type TFT is covered with the resist mask, a n-type impurity or a p-type impurity is added, next, the other one is covered with the resist mask and the n-type impurity or the p-type impurity is added might be employed.

Subsequently, an inter interlayer insulating film is formed using a plasma CVD method or a sputtering method. For example, a silicon nitride film and the other dielectrics may be used as a single layer or a laminated layer structure. Then, the step of treating the activation of the impurity element added to the respective semiconductor layers is carried out. This activation step is carried out by a thermal treatment using a furnace annealing furnace. As for a temperature of the thermal treatment, it may be carried out at 400–700° C., representatively at 500–550° C. It should be noted that a laser annealing method, or a rapid thermal annealing method (RTA method) could be applied except for the thermal annealing method. Owing to this thermal treatment, hydrogen contained by the inter interlayer insulating film is discharged, and the semiconductor layer can be hydrogenated.

Subsequently, the patterning for the purpose of forming a contact hole reaching to the source wirings and a contact hole reaching to the respective impurity regions is performed. Then, the wirings for electrically connecting to the respective impurity regions are formed. It should be noted that for these wirings, a single or a laminated layer film composed of titanium (Ti) film or the other alloy films is formed by performing the patterning. The TFT is made completed via these steps. These steps are not shown. According to the procedure described above up to this point, a CMOS circuit in which two transistors having a Gate Overlap LDD structure are combined within the same substrate can be fabricated.

Example 2

Although Example 1 is an example which describes a method of fabricating a control circuit using what is called a CMOS circuit, in the present Example, a method of fabricating a TFT having a Gate Overlap LDD structure and a TFT having a single drain structure being made mixed will be described below. Specifically, that is a fabricating method in which the patterning step has been added once more to the fabricating method of Example 1. Two kinds of TFTs having a single drain structure whose widths on the active layer of the gate electrode are different from each other depending upon the order in which the foregoing patterning step is added can be formed. Therefore, it can be said that two kinds of fabricating methods exist for the method of fabricating a TFT having a Gate Overlap LDD structure and a TFT having a single drain structure being made mixed. Hereinafter, the first fabricating method will be described below in detail.

First, the first method of fabricating a TFT having a Gate Overlap LDD structure which is Example of the present invention and a TFT having a single drain structure being made mixed will be described below with the reference to FIG. 4. The present Example is an example to which a method of fabricating two or more of the TFTs having a Gate Overlap LDD structure within the same substrate is applied. Therefore, since the steps from FIG. 3A to FIG. 3E are overlapped with the steps from FIG. 4A to FIG. 4E basically described in Example 1, the explanation is omitted, and hereinafter, the explanation will be started below from the step of FIG. 4F in which the resist mask for covering the n-channel type TFT region 417a is formed by performing the patterning.

A resist mask 418 is formed so as to cover the N-channel type TFT region 417a by the known patterning method (see FIG. 4F). Next, an anisotropic etching treatment of tantalum nitride (TaN) film is carried out to the p-channel type TFT region 417b. A gate electrode film of the first layer 416f is anisotropically dry-etched by utilizing the foregoing gate electrode film of the second layer (tungsten (W) film) 414f. As a result of this, the gate electrode film of the first layer (TaN film) 416g is formed (see FIG. 4G). It should be noted that it is preferable that the etching of TaN film is carried out under the conditions where the etching is of a complete anisotropic etching. At this time, since the N-channel type TFT has been covered with the resist mask 418, the N-channel type TFT is not etched. Although as for the p-channel type TFT, the channel region covered with the hard mask 412f is not etched, the tantalum nitride (TaN) film located in the Lov region which has not been covered is etched.

Next, the resist mask 418 is peeled off, and further, the hard mask 412f is peeled off. In this way, the gate electrode of the N-channel type TFT 417a region becomes a gate electrode having a two-layer structure in a hut shape gate form, the gate electrode of the p-channel type TFT becomes in a usual form.

Furthermore, via the same steps with FIG. 3G and FIG. 3H described in Example 1, the impurity is added to the source and drain regions of the n-channel type TFT, the Lov region, the p-channel type source and drain regions under the predetermined conditions. In this way, the first impurity regions 419, 420 which are high concentration impurity regions in the n-channel type TFT, and the second impurity regions 423, 424 which are low concentration impurity regions in the n-channel type TFT are formed, and the usually high concentration impurity regions 421, 422 are formed in the source and drain regions in the p-channel type TFT. Subsequently, the interlayer insulating film is formed.

Then, the impurities added to the respective semiconductor layer are subjected to the step of treating the impurities to activate.

Subsequently, the patterning is performed in order to form a contact hole reaching to the source wirings and a contact hole reaching to the respective impurity regions. Then, the wirings electrically connecting to the respective impurity regions are formed. The TFT is completed via these steps. These steps are not shown. According to the procedure described above, a TFT having the N-channel type Gate Overlap LDD structure and a TFT having the p-channel type single drain structure being made mixed within the same substrate can be fabricated.

Example 3

Next, the second method of fabricating a TFT having a Gate Overlap LDD structure which is Example of the present invention and a TFT having the single drain structure being made mixed will be described below with reference to FIG. 5. The present Example is an example to which a method of fabricating two or more of TFTs having the Gate Overlap LDD structure described in Example 1 within the same substrate is applied. Therefore, since the steps from FIG. 3A to FIG. 3D basically described in Example 1 are overlapped with the steps from FIG. 5A to FIG. 5D, the explanation is omitted, hereinafter, the explanation will be started below from the step of forming the resist mask for covering the P-channel type TFT region 517*b* by performing the patterning (FIG. 5E).

Figure 5A:
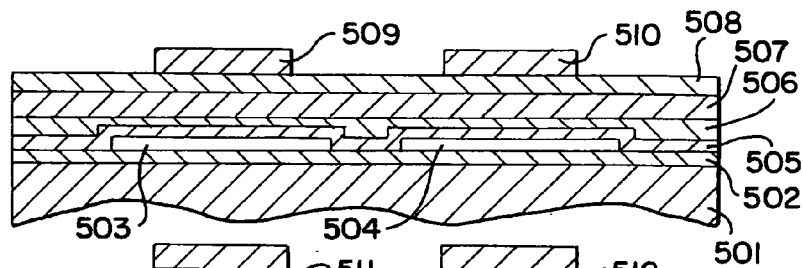
FIG. 5 is a diagram showing the second method of fabricating a TFT having a Gate Overlap LDD structure and a TFT having a single drain structure being made mixed according to the present invention.
Figure 5B:
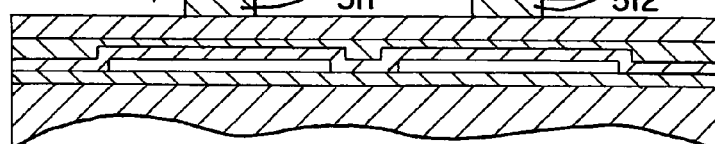
Figure 5C:
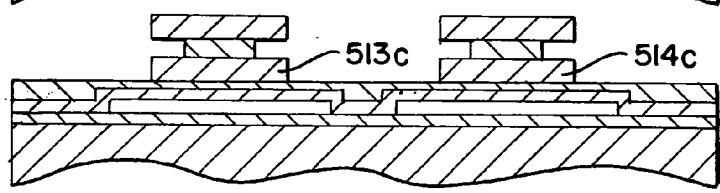
Figure 5D:
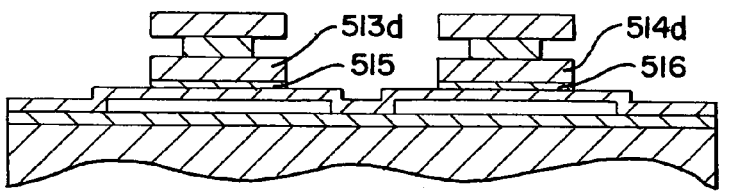
Figure 5E:
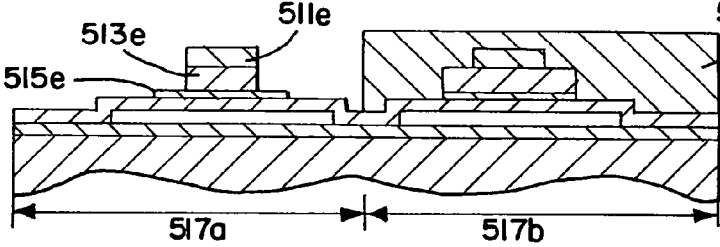
Figure 5F:
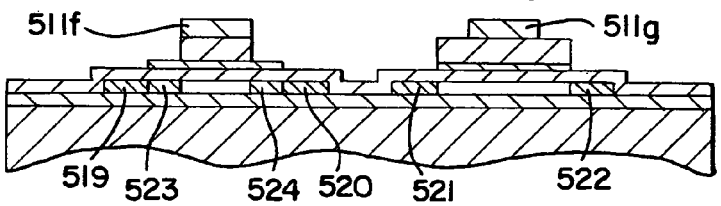

The resist mask 518 is formed so as to cover the P-channel type TFT region 517*b* by the known patterning method (see FIG. 5E).

Next, the etching of the Lov region is carried out using a channel mask. The gate electrode film of the second layer 513*d* is anisotropically dry-etched by utilizing the gate electrode film of the first layer 515*e* as an etching stopper, and only the gate electrode film of the first layer 515*e* is remained in the Lov region (see FIG. 5E). It is etched by a method similar to the method in which only the gate electrode film of the second layer 507 was anisotropically dry-etched at the time when the Gate Overlap LDD structure gate was etched. Moreover, if the size adjustment is required, the size may be adjusted similarly to the case where the Gate Overlap LDD gate has been etched. At this time, since the p-channel type TFT has been covered with the resist mask 518, the p-channel type TFT is not etched. In the n-channel type TFT, the channel region covered with the hard mask 511*e* is not etched, however, the gate electrode film (tungsten (W)) of the second layer located in the Lov region which has not been covered is etched.

Next, the resist mask 518 is peeled off, and further, the hard mask 511*f*, 511*g* are peeled off. In this way, the gate electrode of the n-channel type TFT becomes in a hut shape gate form, and the gate electrode of the n-channel type TFT becomes in a usual form.

Furthermore, via the same steps with FIG. 3G and FIG. 3H described in Example 1, the impurity is added to the source and drain regions of the n-channel type TFT, the Lov region, the source and drain regions of the p-channel type TFT under the predetermined conditions. In this way, the first impurity regions 519, 520 which are high concentration impurity regions in the n-channel type TFT and the second impurity regions 523, 524 which are low concentration impurity regions in the n-channel type TFT are formed, and the usual high concentration impurity regions 521, 522 are formed in the source and drain regions in the p-channel type TFT (see FIG. 5F). Subsequently, the TFT is completed via the interlayer insulating film formation step, the activation step, the contact hole formation step, and the wiring formation step. These steps are not shown. According to the procedure described above, a n-channel type TFT having the Gate Overlap LDD structure and a p-channel type TFT having the single drain structure being made mixed within the same substrate can be fabricated.

Example 4

In the present Example, a method of fabricating TFTs having a Gate Overlap LDD structure whose Lovs are different being made mixed will be described below. Although basically it is fabricated similarly to Example 1, it is different in the following points: at targeted Lov values, specifically, at every kind of lengths of the regions overlapped with the gate electrode out of the LDD regions, the formation of a mask is carried out. Then, the etchings of the Gate Overlap LDD gates are separately carried out. Moreover, the thickness of the hard mask is made less than the minimum value of the Lov, and the over-etching amount at the time when a wet etching is performed, whereby a method of controlling the size of the hard mask is employed.

A method of fabricating TFTs having a Gate Overlap LDD structure whose Lovs are different, which are Examples of the present invention being made mixed will be described below. The present Example is an example to which a method of fabricating two or more of TFTs having the Gate Overlap LDD structure described in Example 1 within the same substrate is applied. Therefore, the explanation common to the explanation described in Example 1 is omitted, the modifications will be described in detail below. In the present Example, a method of forming a TFT whose Lov is 0.3 μm and a TFT whose Lov is 0.5 μm within the same substrate will be described below with reference to FIG. 6.

Figure 6A:
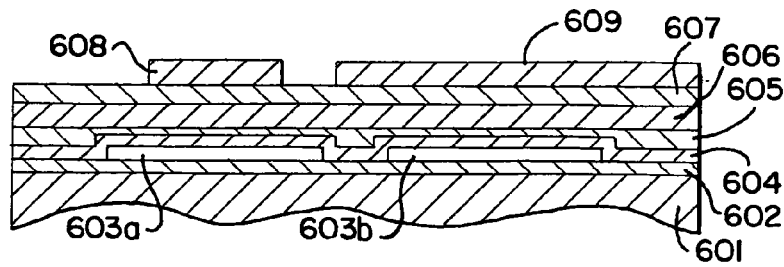
FIG. 6 is a diagram showing a method of fabricating TFTs having Gate Overlap LDD structure whose Lovs are different from each other being made mixed according to the present invention.
Figure 6B:
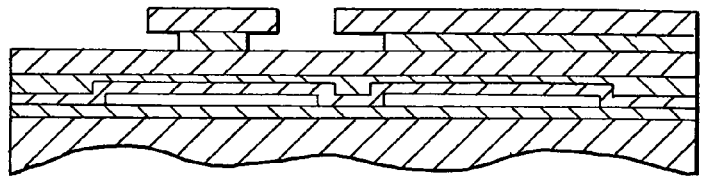
Figure 6C:
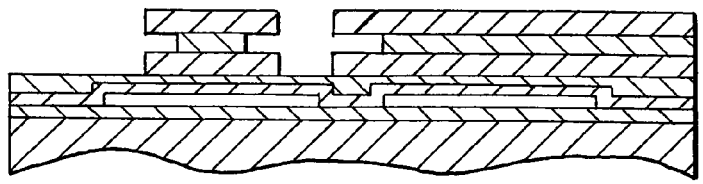
Figure 6D:
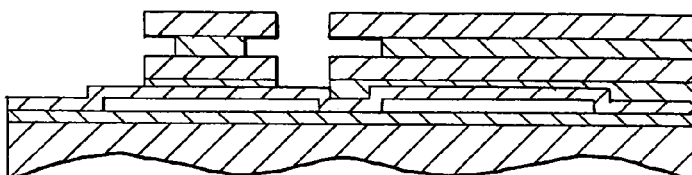

First, as shown in FIG. 6A, an under coat film 602, an active layer 603, and a gate insulator film 604, a gate electrode film of the first layer 605 as the first electrically conductive film, a gate electrode film of the second layer 606 as the second electrically conductive film, and a hard mask layer 607 is formed into a film on a substrate 601. The thickness of the hard mask layer 607 must be equal to or less than 0.3 μm which is a value of the Lov to be targeted.

Next, a resist mask is formed. As for a TFT region whose Lov value has been made 0.3 μm, a resist mask 608 is formed, and it is made a Gate Overlap LDD gate mask. A resist mask 609 is formed so as to cover the whole of the TFT region whose Lov value has been made 0.5 μm. Such a resist mask can be easily formed by changing the design of the pattern on the reticle for patterning used in Example 1.

Then, the Gate Overlap LDD gate etching is carried out to only the TFT whose targeted Lov value is 0.3 μm by steps similar to the steps from FIG. 3A and FIG. 3D in Example 1. Subsequently, the resist masks 608, 609 are peeled off.

It should be noted that the size of the hard mask 607 is controlled by controlling the over-etching amount at the time when the wet etching is carried out, and the size difference comparing to the resist mask 608 is made 0.3 μm on one side.

Figure 6E:
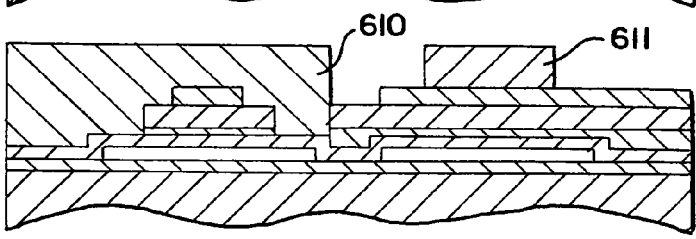

In the state proceeded up to this stage, the TFT region whose targeted Lov value is 0.3 μm is in a state where it is shown in FIG. 6E, the length from the edge of the gate electrode pattern to the edge of the hard mask is 0.3 μm, which is equal to the Lov value to be targeted. On the other hand, as for the TFT region whose targeted Lov value is 0.5 µm, the whole of the hard mask layer 607 is not etched and remained, and it is in a state shown in FIG. 6A.

Next, a resist mask is formed. As for the TFT region whose Lov value has been made 0.5 µm, a resist mask 611 is formed by patterning. This becomes a Gate Overlap LDD gate mask. At this time, at the same time, a resist mask 610 is formed so as to cover the whole of the TFT region whose Lov value is 0.3 µm. Such a resist mask can be easily formed by changing the design of the pattern on the reticle for patterning used in Example 1. Furthermore, a hard mask is formed by a wet etching using the resist masks 610 and 611. The size of the hard mask 607g is controlled by controlling the over-etching amount at the time when the wet etching is carried out, and the size difference with the resist mask 611 is made 0.5 µm on one side.

Then, the Gate Overlap LDD gate etching described above is carried out only to the TFT region whose targeted Lov value is 0.5 µm. This is carried out by performing the steps similar to the steps from FIG. 3A to FIG. 3D in Example 1. Subsequently, the resist masks 610, 611 are peeled off.

Figure 6F:
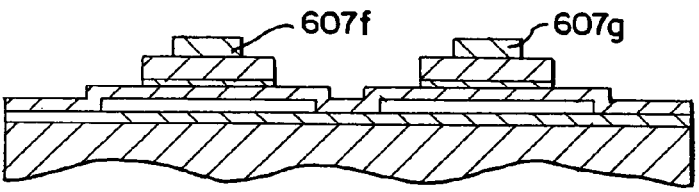
Figure 6G:
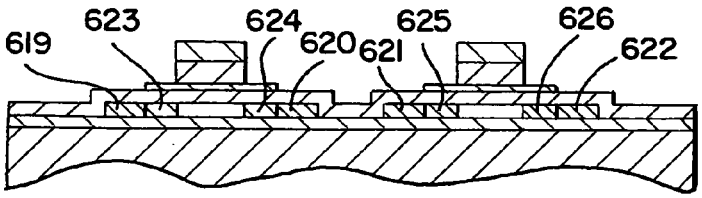
Figure 8A:
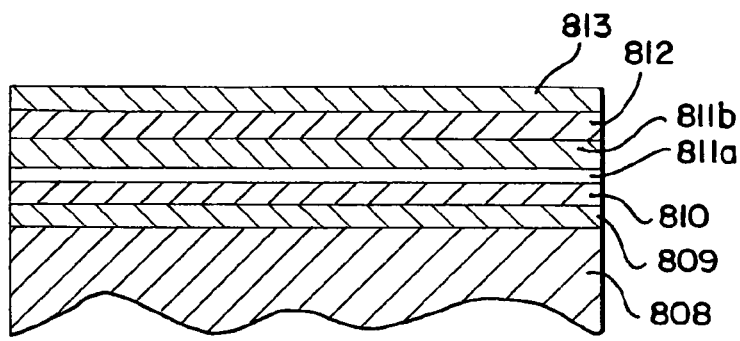
FIG. 8 is a diagram showing the step of forming a mask.
Figure 8B:
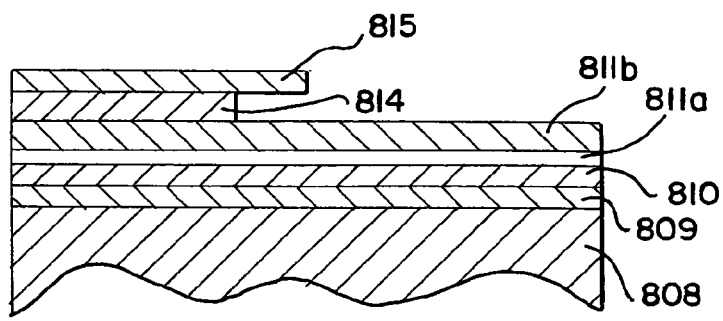
Figure 9A:
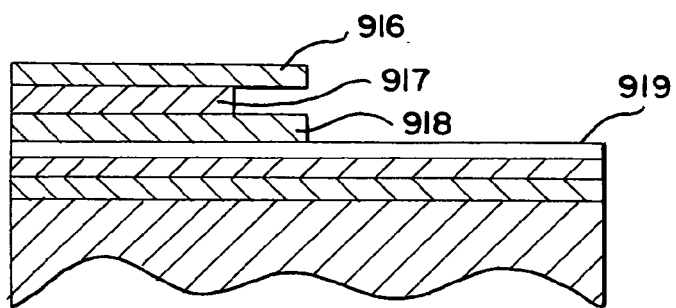
FIG. 9 is a diagram showing the step of forming a gate.
Figure 9B:
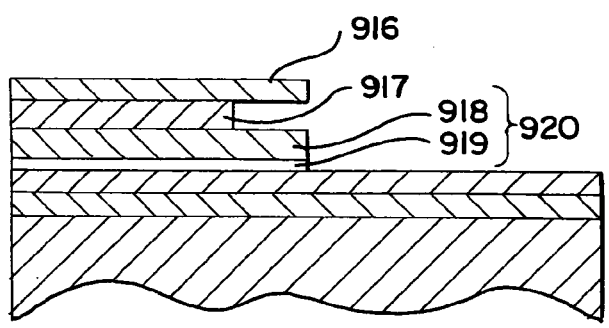
Figure 9C:
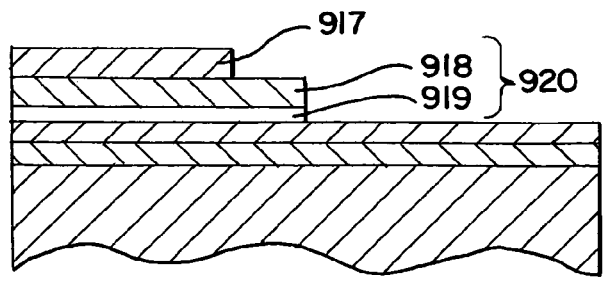
Figure 10A:
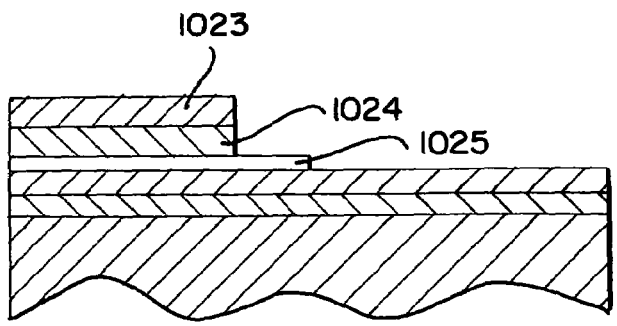
FIG. 10 is a diagram showing how only the gate electrode film of the second layer is anisotropically dry-etched by utilizing the hard mask as a mask.
Figure 10B:
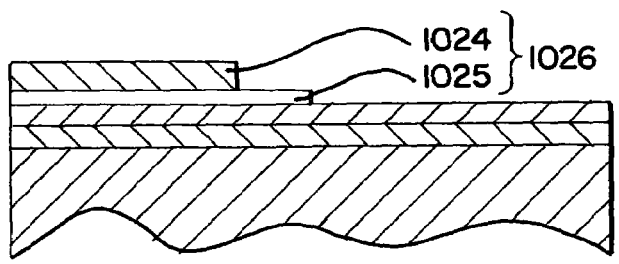

In the state proceeded up to this stage, the TFT region whose targeted Lov value is 0.5 µm has been in a state shown in FIG. 6F, the length from the edge of the gate electrode pattern to the edge of the hard mask is 0.5 µm, which is equal to the targeted Lov value. On the other hand, as for the TFT region whose targeted Lov value is 0.3 µm, it was not etched and not changed from the state of the previous step without being etched because it was entirely covered with the resist mask 610 at the time when the Gate Overlap LDD gate etching of the TFT region whose Lov value is 0.5 µm was carried out. Specifically, it remains in the state shown in FIG. 6E, the length from the edge of the gate electrode pattern to the edge of the hard mask is 0.3 µm, which is equal to the targeted Lov value.

Next, the Lov region etching is carried out to the two TFT regions of TFT region whose targeted Lov value is 0.3 µm and TFT region whose targeted Lov value is 0.5 µm using the hard masks 607f, 607g which are channel masks. Only the gate electrode film of the second layer is anisotropically dry-etching treated by performing the steps similar to the steps shown in FIG. 3E in Example 1. Subsequently, the hard masks 607f, 607g are peeled off.

In this way, as for a Lov, in the TFT region whose targeted Lov value is 0.5 µm, the Lov becomes 0.3 µm, and in the TFT region whose targeted Lov value is 0.5 µm, the Lov becomes 0.5 µm. Both attain the targeted Lov. In this way, hut shape gates having Lovs which have been targeted can be formed, a TFT having the Gate Overlap LDD structure whose Lov is 0.3 µm and a TFT having the Gate Overlap LDD structure whose Lov is 0.5 µm being made mixed within the same substrate can be formed.

Furthermore, via the same steps with FIG. 3G and FIG. 3H described in Example 1, the impurity is added to the source and drain regions of the n-channel type TFT, and the Lov region, the source and drain regions of the p-channel type TFT, and the Lov region. In this way, the first impurity regions 619–622 which are high concentration impurity regions and the second impurity regions 623–626 which are low concentration impurity regions are formed in the n-channel type TFT and in the p-channel type TFT.

Subsequently, an interlayer insulating film is formed. Then, the step of treating the activation of the impurity element added to the respective semiconductor layers is carried out.

The patterning for the purpose of forming a contact hole reaching to the source wirings and a contact hole reaching to the respective impurity regions is performed. Then, the wirings for electrically connecting to the respective impurity regions are formed. The TFT is completed via these steps. These steps are not shown. According to the procedure described above up to this point, an n-channel type TFT having the Gate Overlap LDD structure and a p-channel type TFT having the Gate Overlap LDD structure, whose Lov regions are different, being made mixed can be fabricated within the same substrate.

Example 5

Next, a method of fabricating a TFT structure having only the Loff region is shown by modifying a method of fabricating a transistor having a Gate Overlap LDD structure of Example 1.

In the present Example, a method of fabricating a TFT having a Loff region will be described below with reference to FIG. 7. Since a fabrication method basically from the resist mask pattern step to the step of etching only the gate electrode film of the second layer, that is, the steps from FIG. 3A to FIG. 3C is the same with the invention of Example 1, here, the explanation on these is omitted. Since only the gate electrode films (tungsten (W) film) of the second layer 713, 714 are etched under the etching conditions shown in FIG. 3C, the gate electrode film (tantalum nitride (TaN)) of the first layer 706 remains without being etched. The reason why the gate electrode film (TaN) of the first layer is made remained is for the purpose that the gate insulator film and the active layer of the source and drain regions are not deleted at the time when the channel etching is carried out, which is described later. However, in the case where the gate electrode film (W film) of the second layer is etched under the etching conditions where it is not needed to consider this, the gate electrode film of the first layer may be etched without remaining the gate electrode film of the first layer.

It should be noted that it is desirable that this etching is carried out under the conditions where the etching is of a complete anisotropic etching. Since if the complete isotropic etching is used, the gate electrode film (W film) is etched to the beneath the resist mask, it is not desirable. In the case where it is etched under the conditions being slightly shifted to the isotropic etching, the size adjustment may be performed according to the convenient procedure described in Example 1.

Next, the resist masks 709, 710 are peeled off, and the hard masks 711, 712 are exposed. This step is not shown. Then, the resist mask 718 is formed so as to cover the p-channel type TFT region 717b by the known patterning method (see FIG. 7D). Subsequently, the n-type high concentration impurity is added to the source and drain regions of the n-channel type TFT. In the present Example, since the gate electrode of the first layer is made remained in the source and drain regions, the high concentration impurity is added by making the high concentration impurity penetrate through the gate electrode film of the first layer and the gate insulator film. In the case where the portion up to the gate electrode film of the first layer has been removed by carrying out the etching using a gate Loff mask, the high concentration impurity is added by making the high concentration impurity penetrate through only the gate insulator film. However, since the Loff region have been masked with the gate electrode film of the first layer and the gate electrode film of the second layer, the impurity is not added at all. Owing to this, only the source and drain regions become high concentration impurity regions, and the first impurity regions 719, 720 are formed (see FIG. 7D).

Subsequently, the resist mask 718 is peeled off. Next, the resist mask 721 is formed so as to cover the n-channel type TFT region 717a by the known patterning method (see FIG. 7E). Subsequently, the p-type high concentration impurity is added to the source and drain regions of the p-channel type TFT. Concerning with the conditions for the addition of impurity, the case of the n-channel type TFT applies correspondingly to the conditions, and here, these are omitted. Owing to this, only the source and drain regions become high concentration impurity regions, and the first impurity regions 721, 722 are formed (see FIG. 7E).

Next, the resist mask 721 is peeled off after the impurity has been added, and the hard mask 711 is exposed. Then, the channel etching is carried out using the hard masks 711, 712, that is, a channel mask. Since in the present Example, the gate electrode film (TaN) of the first layer is made remained as an etching stopper, after the gate electrode film (W) of the second layer of the Loff region has been etched, the gate electrode film (TaN) of the first layer is etched. It should be noted that Example 1 applies correspondingly to the conditions of the etching. In the case where the gate electrode film (TaN) of the first layer has been removed without remaining at all using a gate Loff mask (mask for covering the region in which the channel region and the Loff region are combined), the gate electrode film (W) of the second layer and the gate electrode film (TaN) of the first layer in the Loff region are removed. In this way, the electrically conductive layers 723a, 723b of the first shape are formed (FIG. 7F). It should be noted that it is desirable that this etching might be carried out under the conditions where the etching is of a complete anisotropic etching. If it is necessary, the size adjustment is performed.

Next, the hard masks 711, 712 are removed by a wet etching. Then, the resist mask 729 is formed so as to cover the p-channel type TFT region 717b by the known patterning method (see FIG. 7G). Subsequently, the N-type low concentration impurity is added to the Loff region of the n-channel type TFT. The impurity is added by making the impurity penetrate through the gate insulator film. It should be noted that the impurity might be added to the Loff region by making the impurity penetrate through the gate electrode of the first layer and the gate insulator film before the gate electrode film (TaN) of the first layer in the Loff region is removed.

Subsequently, the resist mask 729 is peeled off. Next, the resist mask 724 is formed so as to cover the n-channel type TFT region 717a by the known patterning method (see FIG. 7H). Subsequently, the p-type low concentration impurity is added to the source and drain regions of the p-channel type TFT. Concerning with the conditions for the addition of impurity, the case of the n-channel type TFT applies correspondingly to the conditions, and here, these are omitted. Owing to this, the source and drain regions become high concentration impurity regions, and the first impurity regions 719–722 and the second impurity regions 725–728 are formed (see FIG. 7H).

Subsequently, an interlayer insulating film is formed. Then, the step of treating the activation of the impurity element added to the respective semiconductor layers is carried out.

The patterning for the purpose of forming a contact hole reaching to the source wirings and a contact hole reaching to the respective impurity regions is performed. Then, the wirings for electrically connecting to the respective impurity regions are formed. The TFT is completed via these steps.

These steps are not shown. According to the procedure described above up to this point, the TFT having only the N-channel type Loff region and the TFT having only the p-channel type Loff region being made mixed can be fabricated within the same substrate.

In the present Example, Loff value of the two TFTs within the same substrate are made all the same, however, a method of fabricating a semiconductor device in which TFTs having the different Loff values and TFT having a single drain structure (Loff=0) are mixed on the same substrate may be used by carrying out the formation of the laminated layer mask and the gate Loff etching at every Loff value.

Example 6

In the present Example, a method of fabricating a transmission liquid crystal display device using a TFT having a Gate Overlap LDD structure will be described below. It should be noted that since it is fabricated by the method being basically the same with the fabrication method described in Example 1, the explanation to be overlapped is omitted.

First, a method of fabricating a TFT array substrate which is one of the constituents of the liquid crystal display device will be described below.

Figure 11:
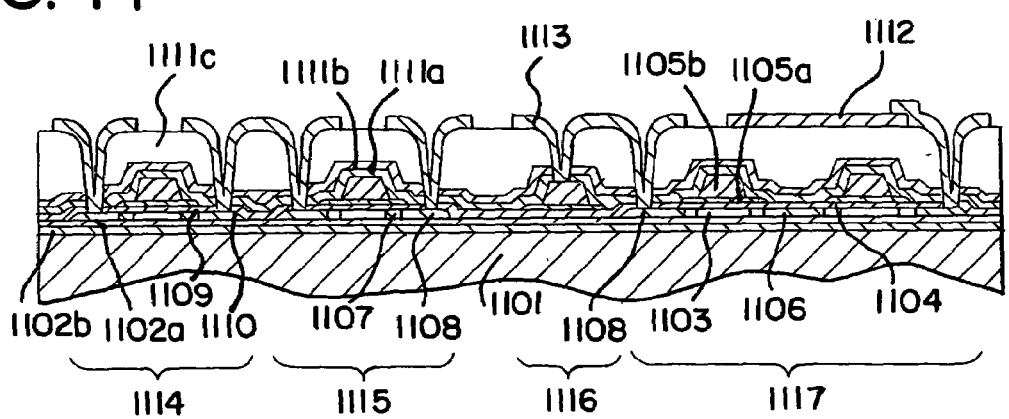
FIG. 11 is a diagram showing a method of fabricating a TFT array substrate.

In FIG. 11, a substrate 1101 for fabricating a TFT is prepared. Next, an undercoat insulator film 1102 (1102a, 1102b) for preventing the impurity diffusion from the substrate is formed on the substrate 1101. For the under coat insulator film 1102, the film having the insulating property such as a silicon oxide film, a silicon nitride film or the like is used.

A semiconductor layer 1103 is formed on the under coat insulator film 1102. After forming an amorphous silicon film, a crystalline silicon film is obtained by crystallizing the amorphous silicon film and is formed into a desired shape by the photolithography and the etching to form a semiconductor layer 1103. The semiconductor layer 1103 is formed by performing the photolithography and the etching a crystalline silicon film obtained by crystallizing the foregoing amorphous silicon film into a desired shape after the amorphous silicon film has been formed. The impurity for controlling the threshold voltage of the element is added to the semiconductor layer 1103. As the foregoing impurity, phosphorus, boron or the like is used. The addition of the foregoing impurity is carried out by performing the doping after the foregoing amorphous silicon film has been formed, after the foregoing amorphous silicon film has been crystallized, or after the semiconductor layer 1103 has been formed. Moreover, an amorphous silicon film to which the foregoing impurity has been added may be used.

Next, a gate insulator film 1104 is formed on the semiconductor layer 1103. As for the insulator 1104, a silicon oxide film having the thickness in the range from 100 nm to 120 nm is formed into a film. The thickness of the gate insulator film 1104 may be available even in a size being equal to or less than 100 nm, or being equal to or more than 120 nm according to the necessity. An insulator such as a silicon nitride film or the like except for the foregoing silicon oxide may be available.

Gate electrodes 1105 (1105a, 1105b) are formed on the gate insulator film 1104. The electrically conductive film which has been formed having the thickness in the range from 20 to 100 nm 1105a and the electrically conductive film which has been formed having the thickness in the range from 100 to 400 nm 1105b are laminated and formed into a film on the gate insulator film 1104, whereby the gate electrode 1105 in a desired shape is formed by performing the photolithography and the etching. In the present Example, tantalum nitride (TaN) is used for the electrically conductive film 1105*a* and tungsten (W) is used for the electrically conductive film 1105*b*.

A n⁻ region 1106 is formed. The n⁻ region 1106 is formed by doping phosphorus in the whole of the semiconductor layer. In the present Example, phosphorus is used, however, if it is a n-type impurity element, arsenic (As) or the like may be used. Moreover, a method such as an ion injection method or the like may be used except for the ion doping method.

A n region 1107, and a n⁺ region 1108 are formed. After it has been resist-masked so that the n-type impurity is not added to the region except for the n⁻ region 1107, and the n+region 1108, the n region and the n⁺ region are formed by doping phosphorus. Phosphorus is doped into the n region 1107 by making phosphorus penetrate through the gate electrode 1105*a*. Moreover, phosphorus is doped into the n⁻ region by making phosphorus penetrate through the insulator film remaining on the semiconductor layer 1103. In the present Example, although the doping for forming the n⁻ region 1107 and the doping for forming the n⁺ region 1108 are carried out at the same time, the doping conditions may be separately changed for the n⁻ region formation and for the n⁺ region formation and the doping may be carried out separately for these regions. Moreover, a n-type impurity such as arsenic (As) or the like except for phosphorus may be used, and an adding method such as an ion injection method or the like may be also used except for the ion doping method.

A p⁻ region 1109, and a p⁺ region 1110 are formed. After it has been resist-masked so that the p-type impurity is not added to the region except the p⁻ region 1109, and the p⁺ region 1110, the p⁻ region and the p⁺ region are formed by doping phosphorus. Phosphorus is doped into the p region 1109 by making phosphorus penetrate through the gate electrode 1105*a*. Moreover, phosphorus is doped into the p⁻ region by making phosphorus penetrate through the insulator film remaining on the semiconductor layer 1103. In the present Example, although the doping for forming the p⁻ region 1109 and the doping for forming the p⁺ region 1110 are carried out at the same time, the doping conditions may be separately changed for the p region formation and for the p⁺ region formation and the doping may be carried out separately for these regions. Moreover, a p-type impurity such as arsenic (As) or the like except for phosphorus may be used, and an adding method such as an ion injection method or the like may be also used except for the ion doping method.

An interlayer insulating films 1111 (1111*a*, 1111*b*, 1111*c*) is formed. The interlayer insulating film 1111 is formed with the first interlayer insulating film 1111*a*, and the second interlayer insulating film 1111*b* which are inorganic films and the third inter interlayer insulating film 1111*c* which is an organic film.

A silicon oxide film having the thickness in the range from 50 to 100 nm is used for the first interlayer insulating film 1111*a*. After the first interlayer insulating film 1111*a* has been formed, the impurity added to the semiconductor layer is activated by the heat. The foregoing activation is performed under the atmosphere of nitrogen gas at 550° C. for 1–12 hours by utilizing a furnace. In the present Example, although the activation is performed by utilizing a furnace, a RTA (rapid thermal annealing) or laser may be used. The atmosphere of the foregoing activation, temperature, and time are not limited to the above-described conditions. If it is activated under the atmosphere where the gate electrode 1105 is not oxidized, for example, it is activated by a furnace or RTA under the low oxygen atmosphere, the interlayer insulating film 1111*a* may not be added. Furthermore, in the case where it is activated by a laser, the interlayer insulating film 1111*a* may not be added. Moreover, if there is any material having the heat resistance to the activation temperature, capable of preventing the oxidation of the gate electrode 1105 during the activation, and further, having an excellent light transmission property except for the foregoing silicon oxide film, the material except for the foregoing silicon oxide film may be used.

A silicon nitride film having a thickness in the range from 50 to 100 nm is used for the second interlayer insulating film 1111*b*. After the second interlayer insulating film 1111*b* has been formed, the heat treatment is performed at 350–420° C. for one hour under the nitrogen atmosphere. In the present Example, although the heat treatment is performed under the nitrogen atmosphere, it may be performed under the hydrogen atmosphere of 3–100%. Moreover, the heat treatment time is not limited to one hour. If the heat treatment is performed for one hour under the hydrogen atmosphere of 3–100%, after the activation treatment following that the first interlayer insulating film 1111*a* has been formed, the foregoing heat treatment after the second interlayer insulating film 1111*b* has been formed may not be performed.

An acryl material having a thickness in the range from 0.6 to 1.6 μm is used for the third interlayer insulating film 1111*c*. A material such as polyimide having the insulating property except for acryl may be used. Moreover, an inorganic film having the insulating property may be used. The thickness of the inorganic film is different depending upon the relative dielectric constant of the foregoing inorganic film, however, it is usually in the range from 1 to 3 μm.

A pixel electrode 1112 is formed on the third interlayer insulating film 1111*c*. The pixel electrode 1112 is formed by a photolithography and etching after ITO (Indium Tin Oxide) has been formed into a film. If it is a transparent electrically conductive film, tin oxide or the like may be used except for ITO.

After the pixel electrode 1112 has been formed, a contact hole for connecting the high impurity concentration regions (1108, 1110) and the wiring 1113 is formed by performing the photolithography and the etching.

After the contact hole has been formed, the wiring 1113 is formed. As for the wiring 1113, after the first Ti (titanium) film having a thickness of about 60 nm was formed, a TiN (titanium nitride) film having a thickness of about 40 nm was formed, and further, an Al—Si (Al containing Si of 2 wt %) film having the thickness of 350 nm was laminated and formed into a film, and finally, the wiring 1113 is formed by performing the photolithography and the etching on the laminated layer on which the second Ti film was formed. The first Ti film prevents Al in the Al—Si film from diffusing into the semiconductor layer, and the second Ti film prevents the Al—Si film from generating a hillock. In the present Example, a TiN film is formed, however, it is for the purpose of enhancing the diffusion prevention effect of the foregoing Al, it may be not formed. Moreover, the other electrically conductive film having a lower resistance such as Al—Ti (Al containing Ti) may be used except for Al—Si.

In the present Example, a region in which the pixel electrode 1112 and the wiring 1113 are laminated is provided, whereby the pixel electrode 1112 and the wiring 1113 are electrically connected without forming the contact hole.

Via these steps described above, a TFT array substrate having a drive circuit including a n-channel type TFT having a Gate Overlap LDD structure and a p-channel type TFT having a Gate Overlap LDD structure, and a pixel section having a pixel TFT, a holding capacity and a pixel electrode on the same substrate is fabricated.

Figure 12:
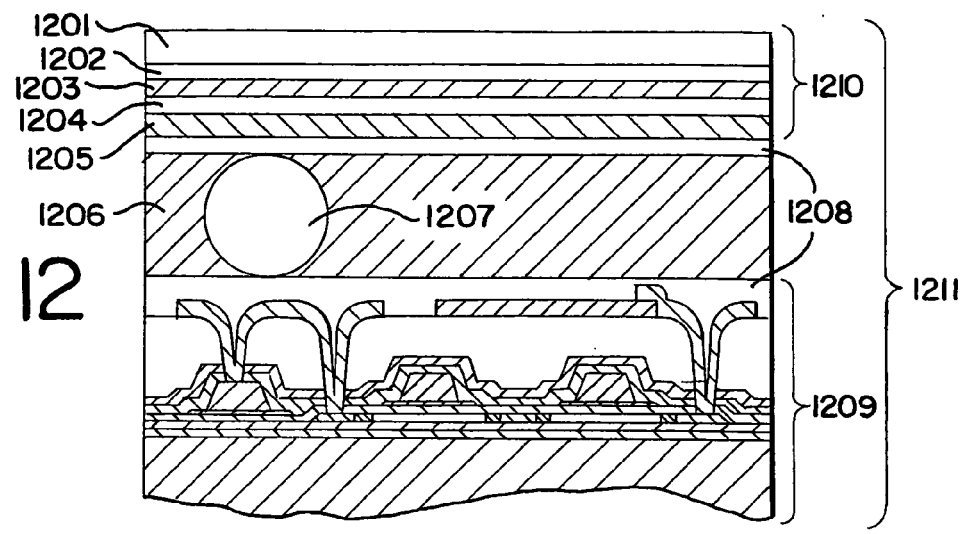
FIG. 12 is a diagram showing how the TFT array substrate and the counter-substrate are overlapped with each other.

Next, a method of fabricating a counter-substrate will be described below. As shown in FIG. 12, light shielding film 1202 is formed on a substrate 1201. The light shielding film 1202 is formed by forming metal chromium into a film, and by exposing to the light and by performing the etching.

A pixel electrode 1205 is formed on the light shielding layer 1202. The pixel electrode 1205 is formed by forming ITO (Indium Tin Oxide) into a film which is a transparent electrically conductive film, and by carrying out the photolithography and the etching.

In the case where a color filter 1203 is provided between the light shielding film 1202 and the pixel electrode 1205, the coloring resin of the targeted color is coated on the light shielding layer 1202 by a spin coat method, and the light exposure and developing are conducted. The foregoing step of forming a color filter is repeated with respect to the respective three color filters of red, blue and green 1203a–1203c (not shown).

A protective film 1204 whose target is to embed and flatten the difference of the stage between the color filter 1203 and the light shielding layer 1202. The protective film 1204 is formed by coating acryl on the color filter. A material capable of flattening it except for acryl may be used. In the case where the color filter is not provided, the protective film 1204 may be not formed. Via the steps described above, the counter-substrate is fabricated.

When the TFT array substrate 1209 and the counter-substrate 1210 were fabricated, a liquid crystal panel 1211 is fabricated using these substrates.

An orientation film 1208 is formed on the side on which the TFT array substrate 1209 of TFTs has been formed and on the side on which the pixel electrode of the counter substrate 1210 has been formed, respectively. An off-set printing method is used for the formation of the orientation film 1208. For the material of the orientation film 1208, polyimide resin is used, but polyamic based resin or the like may be used except for it.

It is made so that a liquid crystal molecule is oriented at a certain pre-tilted angle by performing the rubbing treatment to the side of the TFT substrate on which the orientation film 1208 has been formed and to the side of the counter-substrate on which the orientation film has been formed. After the rubbing treatment has been terminated, the TFT array substrate 1209 and the counter-substrate 1210 are washed for the purpose of removing rubbishes and fallen fibers of the rubbing cloth occurred by the rubbing treatment.

After a sealing agent (not shown) has been coated on the side of the counter-substrate, the foregoing sealing agent is temporarily hardened by heating the counter-substrate 1210 using an oven. After it has been temporarily hardened, a spacer made of a plastic ball is spread on the side on which the pixel electrode of the counter-substrate has been formed.

A liquid crystal panel 1211 is fabricated by pasting both substrates with excellent degrees of precision so that the side of the TFT array substrate 1209 on which the TFTs have been formed and the side of the counter-substrate 1210 on which the pixel electrodes 1205 have been formed are faced each other. A filler (not shown) has been mixed into the sealing agent, both substrates can be pasted together with a uniform interval using the filler and the spacer.

The portion which is not needed out of the substrates pasted together is sheared, and made it into the liquid crystal panel 1211 in a desired size. A liquid crystal material 1206 is injected into the interior of the liquid crystal panel 1211. After the liquid crystal material 1206 has been filled into the whole of the interior of the panel, it is completely sealed with a sealing compound (not shown).

Figure 13:
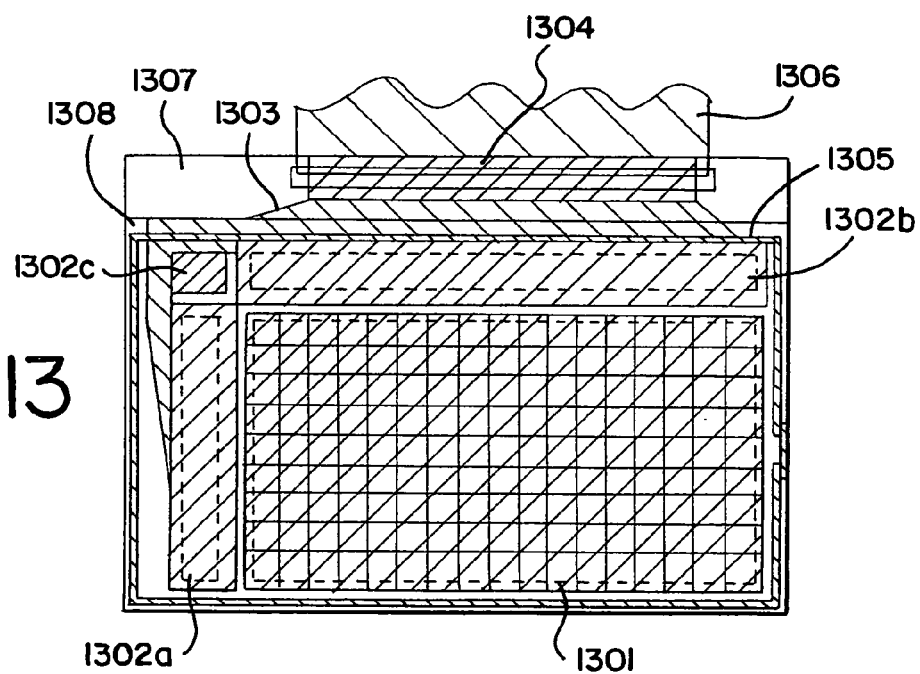
FIG. 13 is a diagram showing the top view of a liquid crystal panel.

FIG. 13 is the top view of the liquid crystal panel 1211. A scan signal drive circuit 1302a and a picture signal drive circuit 1302b are provided on the periphery of the pixel section 1301. Except for these, a signal processing circuit 1302c such as a CPU (Central Processing Unit), a memory and the like may be provided. The drive circuits are connected to an external input and output terminal group 1304 by a connecting wiring group 1303.

In the pixel section 1301, a pixel is formed by a gate wiring group existing and extended from the scan signal drive circuit 1302a and a data wiring group existing and extended from the picture signal drive circuit 1302b crossing in a matrix shape, a pixel TFT, a holding capacity and a pixel electrode are provided at each pixel.

A sealing agent 1305 exists outside of the pixel section 1301, the scan signal drive circuit 1302a, the picture signal drive circuit 1302b, and the signal processing circuit 1302c on the TFT array substrate 1307, and is formed at the portion located inner side than the external input terminal 1304.

Outside of the liquid crystal panel 1211, a flexible printed circuit (FPC) 1306 is connected to the external input and output terminal 1304, and is connected to the respective drive circuits by the connecting wiring group 1303. The external input and output terminal 1304 is formed with the same electrically conductive film with the data wiring group. In the flexible printed circuit 1306, a copper wiring is formed on an organic resin film such as polyimide or the like, and is connected to the external input and output terminal 1304 with an anisotropic electrically conductive adhesive.

A polarizing plate and phase difference plate are mounted so that the linear polarized light in the same direction with the director direction of the liquid crystal molecule of the liquid crystal layer which is the nearest to the counter-substrate is incident into the side of the counter-substrate of the liquid crystal panel 1211. Moreover, the polarizing plate and the phase difference plate are mounted so that the light in the same direction with the director direction of the liquid crystal molecule of the liquid crystal layer which is the nearest to the TFT substrate is outgoing from the side of the TFT substrate of the panel. A liquid crystal display of the present invention can be completed by the method described above.

According to a fabricating method of the present invention, the mask pattern of the first layer can be formed in a self-aligned process and as a mask pattern which is analog and different in the size with respect to the mask pattern of the second layer only by performing the photolithography step once. The hut shape gate can be formed in a self-aligned process by setting the line width located on the active layer so as to be Li in the mask pattern of the first layer, and so as to be L' in the mask pattern of the second layer, and by in turn carrying out the anisotropic etching using the mask pattern of the second layer and the anisotropic etching using the mask pattern of the first layer. Therefore, the problem of a fabricating method being complex along with the miniaturization of the TFTs having the Gate Overlap LDD structure and the only Loff region can be solved by reducing the number of reticles used in the fabricating steps.

Moreover, even in the case where the gate electrode film is configured with a single layer film, a hut shape gate can be formed by precisely controlling the thickness of the gate film on the Lov region upon performing the anisotropic etching by utilizing the mask pattern of the second layer.

Furthermore, according to a fabricating method of the present invention, since the electrically conductive film of the first layer can be utilized as an etching stopper when the electrically conductive film of the second layer is etched, the selection range for the etching conditions of the electrically conductive films can be widened. Therefore, the combination of the first electrically conductive film and the second electrically conductive film which configures the hut shape gate can be optionally selected from the element from Ta (tantalum), W (tungsten), Ti (titanium), Mo (molybdenum), Al (aluminum), and Cu (copper), or optionally selected from the alloy materials and the like whose main component is the foregoing element.

In this way, in the present invention, the gate electrode of the second layer can exert excellent effects which do not exist in the conventional technologies in the point that the material of the gate electrode of the second layer is not limited to an aluminum film or an aluminum alloy film.

According to the present invention, since a refractory metal such as tungsten (W) or the like can be selected as a gate material, the activation of the impurity can be carried out by performing the usual heat treatment (550–800° C.). Therefore, the activation step is not limited to the ion injection method, and it can be carried out by the heat treatment or the heat treatment after the ion injection method. Moreover, the utilization of a refractory metal for a gate material can prevent the characteristics of the electrically active region from being deteriorated by the heat treatment.

According to the present invention, since a metal film having a low resistance value or a film made of composite materials can be utilized as a gate material, and further, the miniaturization of these material can be realized by a self-aligned process, even in the case of a TFT of a miniaturized region, the circuit operation rate of it can be enhanced and it can deal with the tendency to make its speed higher along with the development of very large scale integrations in the recent years.

Moreover, according to a method of fabricating a semiconductor device of the present invention, the size of the resist mask (mask pattern of the second layer) can be set larger than the size of the hard mask (mask pattern of the first layer), the line width of the resist mask on the active layer becomes L', which can be made larger than Li, therefore, even in the process of TFTs having a Gate Overlap LDD structure and an only Loff region whose miniaturization has been progressed, the line width of the resist mask located on the active layer is not miniaturized, and the patterning margin can be enlarged. The enlargement of the patterning margin becomes a big advantage in the case where a substrate having a large scale in which the influence of the distortion of the substrate cannot be ignored is employed.

Furthermore, concerning the hard mask, the dispersion of the film thickness and the occurrences of the irregularity of etching, the corrosion, the film remaining defect and the like can be prevented in the process of the TFTs in which the miniaturization has been progressed by forming the hard mask by performing a wet etching treatment using the resist mask.

What is claimed is:

1. A method of fabricating a semiconductor device, comprising:
    forming a conductive film comprising a single layer or a plurality of layers over a semiconductor film;
    forming a first mask layer over said conductive film;
    forming a second mask over said first mask layer;
    patterning said first mask layer into a first mask pattern whose edge is located inside of said second mask, by etching using said second mask;
    etching said conductive film using said second mask to form a conductive film in a first shape;
    etching said conductive film in said first shape using said first mask pattern to form a gate electrode having an exposed portion thinner than a portion covered by said first mask pattern; and
    forming a channel formation region, first impurity regions sandwiching said channel formation region, and a second impurity region whose impurity concentration is lower than said first impurity regions, which has been provided between said channel formation region and one of said first impurity regions,
    wherein said exposed portion of said gate electrode overlaps with said second impurity region.

2. A method according to claim 1 wherein said second impurity region has a length of 0.25–0.2 μm.

3. A method according to claim 1 wherein said first mask layer and said first mask pattern comprise a material selected from the group consisting of silicon oxide, aluminum, indium tin oxide and amorphous silicon.

4. A method according to claim 1 wherein said first mask layer and said first mask pattern comprise a refractory metal.

5. A method according to claim 1 wherein said conductive film comprises a material selected from the group consisting of tantalum, tungsten, titanium, molybdenum, aluminum, copper, and a semiconductor.

6. A method according to claim 1 wherein said conductive film comprises an alloy comprising a material selected from the group consisting of tantalum, tungsten, titanium, molybdenum, aluminum, and copper.

7. A method according to claim 1 wherein said conductive film comprises a compound comprising a material selected from the group consisting of tantalum, tungsten, titanium, molybdenum, aluminum, and copper.

8. A method of fabricating a semiconductor device, comprising:
    forming a first conductive film over a semiconductor film;
    forming a second conductive film over said first conductive film;
    forming a first mask layer over said second conductive film;
    forming a second mask over said first mask layer;
    patterning said first mask layer into a first mask pattern whose edge is located inside of said second mask, by etching using said second mask;
    etching said second conductive film and said first conductive film using said second mask to form a conductive layer in a first shape;
    selectively etching said second conductive film of said conductive layer in said first shape using said first mask pattern to form a conductive layer in a second shape in which the edge portion of said first conductive film is located outer than the edge portion of the relevant second conductive film; and
    forming a first impurity region which is overlapped with said first conductive film and a second impurity region outside of said first impurity region in said semiconductor film by utilizing said conductive layer in said second shape.

9. A method according to claim 8 wherein said first mask layer and said first mask pattern comprise a material selected from the group consisting of silicon oxide, aluminum, indium tin oxide and amorphous silicon.

10. A method according to claim 8 wherein said first mask layer and said first mask pattern comprise a refractory metal.

11. A method according to claim 8 wherein said first conductive film comprises a material selected from the group consisting of tantalum, tungsten, titanium, molybdenum, aluminum, copper, and a semiconductor.

12. A method according to claim 8 wherein said first conductive film comprises an alloy comprising a material selected from the group consisting of tantalum, tungsten, titanium, molybdenum, aluminum, and copper.

13. A method according to claim 8 wherein said first conductive film comprises a compound comprising a material selected from the group consisting of tantalum, tungsten, titanium, molybdenum, aluminum, and copper.

14. A method according to claim 8 wherein said second conductive film comprises a material selected from the group consisting of tantalum, tungsten, titanium, molybdenum, aluminum, copper, and a semiconductor.

15. A method according to claim 8 wherein said second conductive film comprises an alloy comprising a material selected from the group consisting of tantalum, tungsten, titanium, molybdenum, aluminum, and copper.

16. A method according to claim 8 wherein said second conductive film comprises a compound comprising a material selected from the group consisting of tantalum, tungsten, titanium, molybdenum, aluminum, and copper.

17. A method of fabricating a semiconductor device, comprising:
    forming a first conductive film over a semiconductor film;
    forming a second conductive film over said first conductive film;
    forming a first mask layer over said second conductive film;
    forming a second mask over said first mask layer;
    patterning said first mask layer into a first mask pattern whose edge is located inside of said second mask, by etching using said second mask;
    etching said second conductive film using said second mask to form a conductive layer in a first shape;
    forming a first impurity region in said semiconductor film using said conductive layer in said first shape, and
    forming a conductive layer in a second shape by etching said second conductive film of said conductive layer in said first shape and said first conductive film using said first mask pattern; and
    forming a second impurity region inside of said first impurity region in said semiconductor film using said conductive layer in said second shape.

18. A method according to claim 17 wherein said first mask layer and said first mask pattern comprise a material selected from the group consisting of silicon oxide, aluminum, indium tin oxide and amorphous silicon.

19. A method according to claim 17 wherein said first mask layer and said first mask pattern comprise a refractory metal.

20. A method according to claim 17 wherein said first conductive film comprises a material selected from the group consisting of tantalum, tungsten, titanium, molybdenum, aluminum, copper, and a semiconductor.

21. A method according to claim 17 wherein said first conductive film comprises an alloy comprising a material selected from the group consisting of tantalum, tungsten, titanium, molybdenum; aluminum, and copper.

22. A method according to claim 17 wherein said first conductive film comprises a compound comprising a material selected from the group consisting of tantalum, tungsten, titanium, molybdenum, aluminum, and copper.

23. A method according to claim 17 wherein said second conductive film comprises a material selected from the group consisting of tantalum, tungsten, titanium, molybdenum, aluminum, copper, and a semiconductor.

24. A method according to claim 17 wherein said second conductive film comprises an alloy comprising a material selected from the group consisting of tantalum, tungsten, titanium, molybdenum, aluminum, and copper.

25. A method according to claim 17 wherein said second conductive film comprises a compound comprising a material selected from the group consisting of tantalum, tungsten, titanium, molybdenum, aluminum, and copper.

* * * * *